United States Patent [19]

Char et al.

[11] Patent Number: 5,366,953
[45] Date of Patent: Nov. 22, 1994

[54] METHOD OF FORMING GRAIN BOUNDARY JUNCTIONS IN HIGH TEMPERATURE SUPERCONDUCTOR FILMS

[75] Inventors: Kookrin Char; Stephen M. Garrison, both of Palo Alto; Nathan Newman, Montara, all of Calif.; Gregory G. Zaharchuk, Hamilton Square, N.J.

[73] Assignee: Conductus, Inc., Sunnyvale, Calif.

[21] Appl. No.: 119,133

[22] Filed: Dec. 22, 1993

Related U.S. Application Data

[63] Continuation-in-part of Ser. No. 672,664, Mar. 19, 1991, Pat. No. 5,157,466.

[51] Int. Cl.$^5$ .................... H01L 39/22; H01B 12/00; B05D 5/06; B05D 5/12
[52] U.S. Cl. .................... 505/329; 505/190; 505/410; 505/411; 505/234; 257/33; 257/35
[58] Field of Search .................... 257/33–35, 257/36, 39; 505/190, 191, 234, 239, 329, 410, 411, 413, 702, 729, 731; 427/62, 63

[56] References Cited

FOREIGN PATENT DOCUMENTS 0329603 8/1989 European Pat. Off. .

OTHER PUBLICATIONS

Char et al, "Extension of Bi-Epitaxial Josephson Junction Process to Various Substrates," Appl. Phys. Lett., vol. 59, No. 17, 21 Oct. 1991, pp. 2177–2179.
Char et al, "Bi-Epitaxial Grain Boundary Junctions in YBaCuO," Appl. Phys. Lett., vol. 59, No. 6, 5 Aug. 1991, pp. 733–735.
Char et al, "Grain Boundary Josephson Junctions Created by Bi-Epitaxial Processes," Physica C, vol. 185-189, PT. IV. Dec. 1991, pp. 2561–2562.
Eckstein et al, "BiSrCaCuO Thin Films by Atomically Layered Epitaxy," Appl. Phys. Lett., vol. 57, No. 10, 3 Sep. 1990, pp. 1049–1051.
Laibowitz et al, "All High Tc Edge Junctions and Squids," Appl. Phys. Lett., vol. 56, No. 7, 12 Feb. 1990, pp. 686–688.
Gross et al, "Low Noise YBaCuO Grain Boundary Junction DC Squid's," Appl. Phys. Lett., vol. 57, No. 7, 13 Aug. 1990, pp. 727–729.
Suzuki et al, "Josephson Effect and Small-Angle Grain Boundary in YBCO Thin Film Bridge," IEEE Trans. Mag., vol. 27, No. 2, Mar. 1991, pp. 3320–3323.

Primary Examiner—Rolf Hille
Assistant Examiner—Mahshid Saadat
Attorney, Agent, or Firm—Judith A. DeFranco; Kimberley Elcess

[57] ABSTRACT

A novel method of producing weak-link grain boundary Josephson junctions in high temperature superconducting thin films is disclosed. These junctions are reliably and reproducibly formed on uniform planar substrates (10) by the action of a seed layer (40) placed intermediate the substrate (10) and the superconductor film (20). The superconductor film (22) grown atop the seed (42) is misoriented from the rest of the film (24) by an angle between 5° and 90°. The grain boundary (30) so formed acts as a high quality weak-link junction for superconductor devices. The performance of these junctions can be improved by the addition of buffer layers (50, 60) between the substrate (10) and the superconductor film (20).

34 Claims, 12 Drawing Sheets

METHOD OF FORMING GRAIN BOUNDARY JUNCTIONS IN HIGH TEMPERATURE SUPERCONDUCTOR FILMS

This application is a continuation-in-part of U.S. patent application Ser. No. 07/672,664 filed 19 Mar. 1991, now U.S. Pat. No. 4,157,466 issued 20 Oct. 1992.

TECHNICAL FIELD

The present invention relates to grain boundary weak-link junctions of high-temperature superconductors and methods of fabricating them.

BACKGROUND OF THE INVENTION

Devices made from high-temperature superconductors (HTS) operate at or near the boiling point (77K) of liquid nitrogen, a cheap coolant that is widely available and easy to store, handle, and transport. Superconducting quantum interference devices (SQUIDs) operating near 77K are desirable for a number of applications including non-destructive testing, geophysical surveys, medical imaging, and earthquake detection.

HTS materials are based on anisotropic layered crystalline structures. Colloquially speaking, each unit cell of HTS material has approximately the shape of a shoe box, a rectangular solid in which the three dimensions (a, b, and c) are different—a and b have similar values, and c is approximately three times greater. The superconducting properties in the a and b dimensions are similar, but the superconducting properties in the c dimension are dramatically worse. For reference, if the box is on its end on a table, the so-called "a-b plane" is parallel to the table, and the "c-axis" is perpendicular to the table. The a-b plane contains parallel sheets of copper and oxygen that have excellent superconducting properties. Along the c axis, perpendicular to the planes, the superconducting properties are poor.

In bulk polycrystalline samples of HTS materials, the critical current density (a measure of how much electrical current a superconductor can carry) is low, for two reasons. First, the grains of material are randomly oriented. As a result, in some grains, the current will flow along the dimension where superconducting properties are excellent, but in others, it must flow along the dimensions where superconducting properties are poor. Second, where "high-angle grain boundaries" exist— that is, where the adjacent grains are misoriented by more than 5° and less than 90°—the grain boundaries behave as "weak links," which have degraded superconducting properties.

It is possible to grow thin films of high temperature superconductors which contain no weak links. These films grow in a highly oriented manner, usually with the c axis perpendicular to the substrate and the copper-oxygen sheets parallel to the substrate. Such films are not truly single crystals—virtually all high-quality thin films contain many low-angle grain boundaries and twin boundaries. Fortunately, low-angle grain boundaries (where adjacent grains are misoriented by less than approximately 5°) and twin boundaries (at which the grains are misoriented by approximately 90°) do not degrade superconducting electrical transport properties. Therefore, highly-oriented films which contain no grain boundaries greater than approximately 5° or less than approximately 90° truly have no weak links, and they offer performance equivalent to a single crystal. Such thin films offer the potential for high-performance devices.

WEAK-LINK JUNCTIONS

In the context of the previous discussion of bulk material and high-quality thin films, "weak links" were undesirable—randomly occurring, uncontrolled areas of degraded superconductivity. However, many HTS circuit applications actually require weak links of one type or another. A "weak link junction" is one type of Josephson junction, which is broadly defined as two weakly coupled superconductors. In this paper, we define a weak-link junction as two regions of superconducting film with a given critical current density separated by material in which the critical current density is lower by at least a factor of 10.

Weak-link junctions make it possible to create extremely sensitive instruments to measure magnetic field, voltage, and current. The ability to create weak-link junctions in specific places in a controlled manner is an essential aspect of HTS circuit technology. For some circuit applications, it is desirable to fabricate multiple weak-link junctions in an array.

GRAIN-BOUNDARY WEAK-LINK JUNCTIONS

As mentioned above, high-angle grain boundaries distributed randomly within c-axis oriented $YBa_2Cu_3O_7$ (YBCO) thin films will degrade the supercurrent transport properties of the films. However, the low critical current density of these grain boundaries suggests that they could serve as weak-link junctions. The I-V characteristics of grain boundary weak links are very desirable for device purposes (they can be modeled by a resistively shunted Josephson junction), and their characteristic voltages (as determined by the product of their critical currents and normal-state resistance, or "$I_cR$ products") are satisfactory for use in SQUID devices.

There is a diversity of prior art with respect to grain boundary weak-link junctions. In one technique, a single-crystal substrate, lattice-matched to HTS materials, is cut and rebonded to achieve an in-plane angle of more than 5° between its crystal orientations. When an HTS film is grown on this bicrystal, the grain boundary of the substrate is replicated in the film. High-quality junctions and high-$T_c$ SQUIDs operating up to 87K with low noise have been fabricated by this technique. But the technique has three main drawbacks. First, fabrication of a bicrystal substrate is a complex and difficult procedure. Second, weak link junctions can be located only along the rebonded line. Third, fabrication of large arrays of junctions and SQUIDs is very difficult with this technique.

A second technique relies on polycrystalline, granular films which do contain randomly distributed high-angle grain boundaries. Several groups have fabricated SQUIDs by patterning the device structure and hoping that weak link grain boundaries will chance to occur in the correct locations. However, imprecise control of the placement of the grain boundaries has resulted in poor yields. Furthermore, these polycrystalline, granular films have overall low superconducting transport properties as a result of the high-angle grain boundaries that occur throughout the film. In addition, electrical noise due to flux motion in the randomly located weak links is typically found.

A third technique relies on sharp steps cut into a single crystal substrate. Each of these steps propagates two grain boundaries (at the base and at the top of the step) in a superconducting thin film which grows above it. This technique requires very precise control of several geometric variables and processing steps. In order to gain control of the fabrication process, it is necessary to control precisely the size and slope of the steps, which, on a wafer scale, is a difficult challenge. The inherently non-planar nature of the structure creates additional topological and processing problems for making multilayer circuits. It is difficult, using this technique, to fabricate weak links which have desirable electrical characteristics at or above the temperature of liquid nitrogen.

In the prior art, there is no way to fabricate an HTS multilayer thin film integrated circuit containing a multiplicity of grain boundary weak-link junctions that have similar and highly reproducible I-V characteristics at arbitrarily specified locations, while maintaining a high superconducting transition temperature and high critical current density (i.e., above $1 \times 10^6$ amperes/cm$^2$ at 4.2K) in the superconducting films.

SUMMARY OF THE INVENTION

This invention describes novel and useful methods of depositing superconducting film on two sections of a uniform planar substrate to produce a grain boundary weak-link junction at a predetermined location. (By uniform planar substrate, we mean a substrate that has not been cut and rebonded, whose surface morphology or crystal structure will not propagate grain boundaries into the material deposited onto it. In most cases, the substrate will be a single crystal, but it could be polycrystalline or even amorphous.)

Our novel methods make it possible to form arrays of junctions at specified locations without degrading the properties of the superconducting material in any location other than at the grain boundary weak links. The invention also describes many useful high-temperature superconductor device structures which embody these methods.

This document describes ways of growing a superconducting film as a bicrystal—two distinct areas of superconducting film whose crystal lattices are rotated with respect to each other, either in-plane or out-of-plane, by more than 5° and less than 90°. Since the grain boundary between these two areas has a critical current density at least 10 times lower than the adjacent superconducting film, it displays all the electrical characteristics desirable in a weak-link junction.

One method of inducing the superconducting film to grow as a bicrystal is to deposit intermediate strata of material which cover all or part of the substrate. There are two types of intermediate strata: seed layers and buffer layers. Intermediate layers are usually non-superconducting, but they can be superconducting.

A seed layer serves as a template to determine the crystalline orientation of the layer which overlies it. It can be very thin, even less than one monolayer in thickness. In some cases, for example where a seed layer covers only part of the substrate, it may be desirable to slope the seed layer so it has an angle of less than 45°, even less than 10°; with the angle of the substrate. While seed layers may be less than one monolayer thick, or up to several micrometers thick, seed layers are typically tens of nanometers thick.

A buffer layer has four possible functions: to prevent chemical interactions between the layers above and below, to protect a lower layer from processing steps, to provide an intermediate lattice match between the layers above and below, or to provide a cleaner grain boundary. Buffer layers are usually but not always thicker than seed layers. Their thicknesses may range from 10 nm to several micrometers, and typically are hundreds of nanometers.

It is possible to control the crystal orientations of seed layers, buffer layers, and superconducting films by modifying the growth conditions during deposition— for example, the substrate temperature, the oxygen partial pressure in the deposition chamber, the total gas pressure in the deposition chamber, the film composition, and the density of the plasma at the substrate. Ways of modifying these variables to control the orientation of oxide superconductors are known to people skilled in the art of superconducting thin film deposition.

Another method of controlling the crystal orientations of seed layers, buffer layers, and superconducting films is to modify the surface of an underlying region— for example, by physically abrading the surface, by chemically etching or treating it, by changing its chemical composition, or by graphoepitaxy.

To cause an in-plane or out-of-plane rotation to occur, sometimes a seed layer or substrate that has a poor lattice-match (greater than about 5%) is used. The lattice constants of materials commonly used as substrates for growing high-temperature superconductors such as YBCO are as follows:

| Material | Orientation | Lattice Constant (ångstroms) |
| --- | --- | --- |
| Al$_2$O$_3$ | r-plane | 3.48 |
| LaAlO$_3$ | 100 | 3.79 |
| CaTiO$_3$ | 100 | 3.82 |
| YBCO | 100 | 3.86 |
| SrTiO$_3$ | 100 | 3.91 |
| MgO | 100 | 4.21 |
| YSZ | 100 | 5.14 |
| CeO$_2$ | 100 | 5.42 |

By combining the techniques mentioned above in various ways, it is possible to product grain boundary weak link junctions and arrays of such junctions in a predictable and controlled manner with high yield. The methods are viable for all mixed-metal cuprate and bismuthate superconductors with transition temperatures higher than 15K. Various embodiments of the invention are shown in the drawings-described below.

DETAILED DESCRIPTION OF THE DRAWINGS

Figure 1:
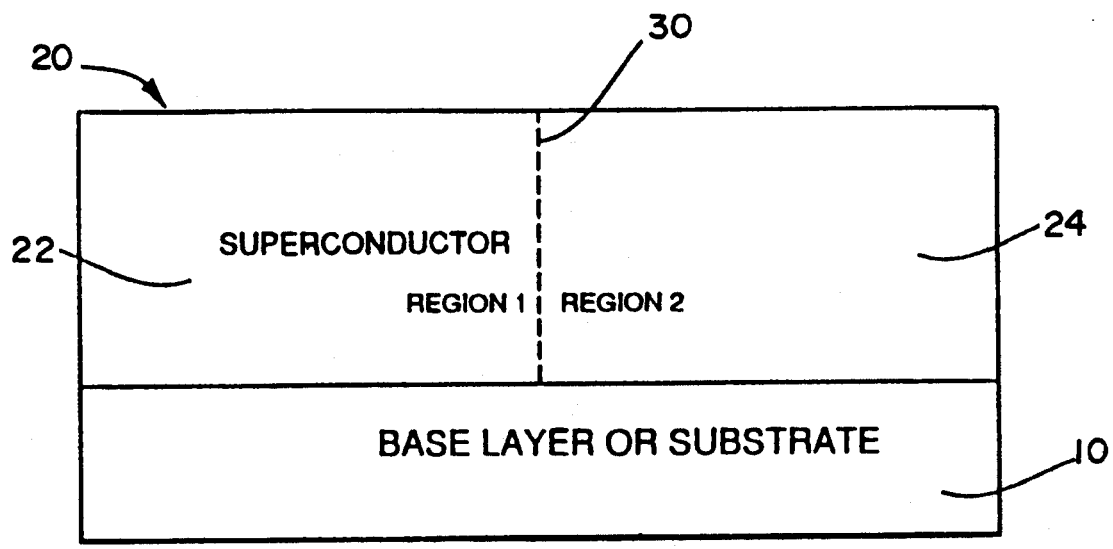
FIG. 1 is a schematic side-view representation of an in-plane weak link grain boundary junction.
Figure 2:
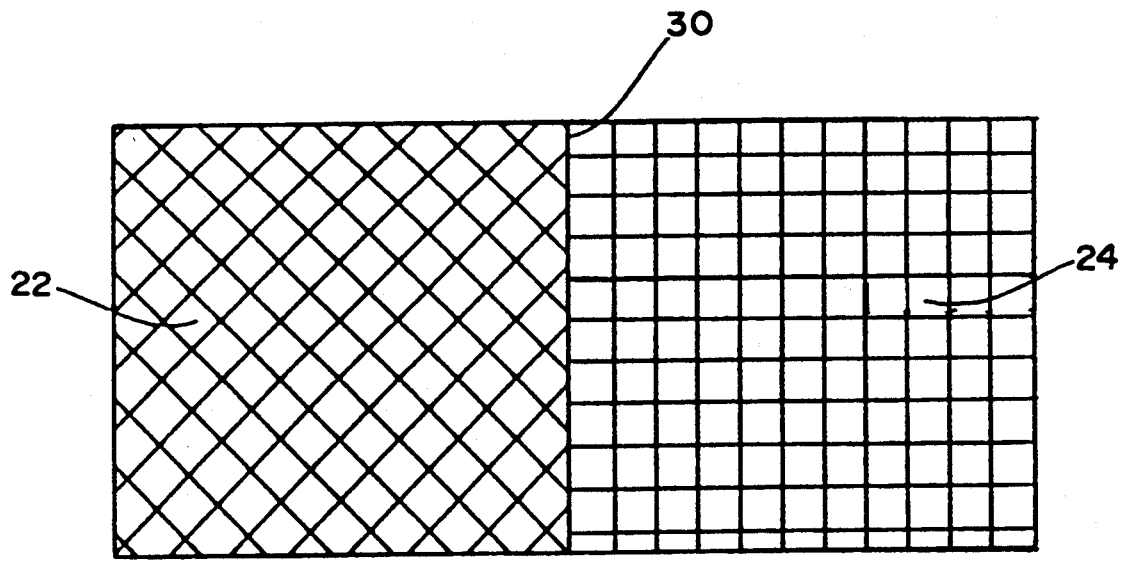
FIG. 2 is a schematic top-view representation of an in-plane weak link grain boundary junction.

FIGS. 1 and 2

FIGS. 1 (cross-sectional view) and 2 (top view) illustrate a weak-link grain boundary junction. A uniform planar substrate (10) supports a layer of superconductor (20) having two regions (22 and 24). Both of these regions contain no high-angle grain boundaries and thus no weak links; they may be single crystals.

In one variation of this embodiment, the crystal lattice of the superconducting film in the first region (22) and the crystal lattice of the superconducting film in the second region (24) are rotated in-plane by more than 5° and less than 90° with respect to each other.

In a second variation of this embodiment, the crystal lattice of the superconducting film in the first region (22) and the crystal lattice of the superconducting film in the second region (24) are rotated out-of-plane by more than 5° and less than 90° with respect to each other.

In both of these variations, there is a grain boundary weak-link junction (30) in the superconducting film at the juncture between the first and second regions.

In the most general sense, the method of creating this structure consists of depositing superconducting film on two adjacent regions of a uniform planar substrate to produce a weak-link grain boundary junction at the juncture between the first region and the second region. More specifically, the method comprises growing the superconducting film in the first region (22) with a different crystal orientation compared to the superconducting film in the second region (24).

In elucidating the method, five more detailed issues must be specified:

i) The method of limiting the superconducting film in the first region (22) so it covers only a portion of the substrate. This can be achieved by many processes standard in the semiconductor industry, such as masking the other portion of substrate, or covering the entire substrate and then removing the material where it is not wanted—the method chosen is arbitrary and does not constitute an important part of this invention.

ii) The method of inducing the superconducting film to grow with one orientation in the first region (22) and a different orientation in the second region (24). One strategy is to control the different orientations by modifying the surface of the substrate. For example, the surface underlying the first region of superconducting material could be physically abraded, chemically etched, chemically treated, modified in chemical composition, or modified by graphoepitaxy. This strategy is not limited to the substrate; it can, in principle, be applied to any subsurface layer in a multilayer structure as a means of controlling the orientation of the layer which deposits onto it. (FIG. 1 can be understood as a structure in which the surface of the substrate underlying one or both region of superconducting film has been physically abraded, chemically etched, chemically treated, modified in chemical composition, and/or modified by graphoepitaxy.)

A second strategy is to deposit the superconducting film in the first region and the superconducting film in the second region under different growth conditions—for example, by modifying the substrate temperature, the density of plasma at the substrate, the total gas pressure in the chamber, or the oxygen partial pressure in the chamber. Methods of varying these deposition parameters to achieve different orientations of superconducting film are well known to people skilled in the art of HTS film deposition.

iii) The nature of the deposition process. Any deposition process may be used, including sputtering, laser ablation, chemical vapor deposition, metalorganic chemical vapor deposition, and liquid phase epitaxy.

iv) The selection of the superconducting material. The superconducting film may be any oxide with a superconducting transition temperature higher than 15K. The HTS materials are mixed-metal cuprates or mixed-metal bismuthates which belong to one of four families: the rare earth cuprates, the thallium-based cuprates, the bismuth-based cuprates, and the alkaline earth bismuthates. The structures and techniques described in this disclosure can be implemented in all known oxide superconductors and any superconducting materials with similar properties which may be discovered in the future.

v) The substrate material. There is no limitation to the material from which the substrate (10) may be chosen, as long as the material supports the growth of materials of suitable quality. The common substrates include those that have a close lattice match with the superconducting materials, such as SrTiO3, CaTiO3, and LaAlO3, and those that do not have a close lattice match with the superconducting materials, such as Al2O3, MgO, and yttria-stabilized zirconia (YSZ).

Another method of growing the superconducting film in the first region with a different crystal orientation compared to the superconducting film in the second region is to grow one or more intermediate layers of material between the substrate and the superconducting film. The intermediate layers may be either seed layers or buffer layers.

A seed layer serves as a template to determine the crystalline orientation of the layer which overlies it. It can be very thin, even less than one monolayer in thickness. In some cases, for example where a seed layer covers only part of the substrate, it may be desirable to slope the seed layer so it has an angle of less than 45°, even less than 10°, with the angle of the substrate.

A buffer layer has four possible functions: to prevent chemical interactions between the layers above and below, to protect a lower layer from processing steps, to provide an intermediate lattice match between the layers above and below, or to provide a cleaner grain boundary.

The thickness of these intermediate layers may be arbitrarily small, even less than one atomic monolayer. (A layer whose thickness is "less than one monolayer" obviously can't contain fractions of atoms; it contains an average of less than one monolayer—i.e., subregions of one monolayer and subregions of no atoms at all.)

We will discuss eight different generic structures which employ intermediate layers, including several embodiments of each and the methods of making them.

FIG. 3

The first generic method of growing the superconducting film in the first region with a different crystal orientation compared to the superconducting film in the second region consists of the following steps: growing one or more seed layers over a portion of the substrate extending over the first region, and growing a superconducting film over both the first region and the second region. This strategy yields the structure shown in FIG. 3.

Figure 3:
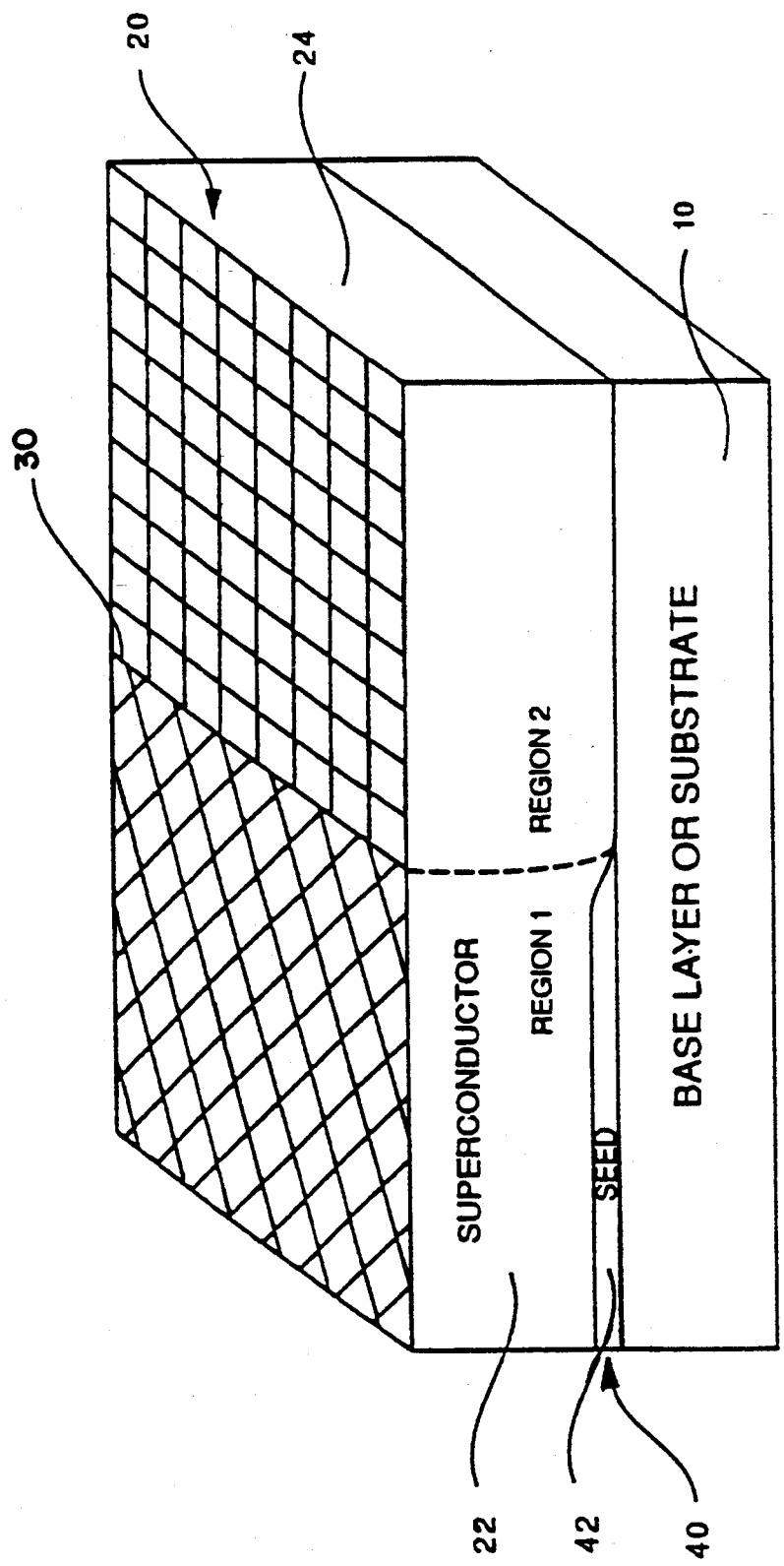
FIG. 3 is a schematic perspective representation of a structure containing a substrate, a seed layer overlying the substrate in the first region, and a superconducting film overlying the first and second regions.

FIG. 3 shows a structure in which one intermediate layer is a seed layer. The lowest stratum is a substrate (10). The next stratum consists of one or more seed layers (40) which extends over a portion of the substrate. The area above and below the seed (42) are defined as the "first region," and the remainder of the structure is defined as the "second region." The uppermost stratum is a superconducting film (20) which extends over both the first region and the second region. The superconducting film has grown with one orientation (22) on the seed layer and with a different orientation (24) on the substrate. As a result, a weak-link grain boundary junction (30) exists in the superconducting film at the juncture between the first region and the second region.

It is always possible to slope seed layers, such as the seed layer shown in FIG. 3. Some of our data suggest that one method of achieving a more clearly defined weak-link grain boundary junction is to physically remove the sharp shoulder of intermediate layers and slope them, so their surface has an angle of less than 45° with the surface of the substrate. Some data even suggest that it is desirable to slope the intermediate layers so they have an angle of less than 10° with the surface of the substrate.

In the interest of illustrating the rich variety of materials from which the structure shown in FIG. 3 can be made, we will describe four different embodiments of the structure and the methods of making them. In all the following embodiments of FIG. 3, the superconducting film material is arbitrarily chosen to be YBCO. The YBCO grows with two different orientations, labeled "HTS" and "HTS'." In seven of the structures (i, ii, iv, v, vi, vii, and viii), a 45° in-plane weak-link grain boundary junction (30) exists in the superconducting film at the juncture between the first region and the second region. In one of the structures (iii), the weak-link grain boundary junction (30) is an out-of-plane grain boundary junction. The language of the structures and the language of the methods seem so nearly identical as to be redundant; we recite both because patent law requires us to disclose every aspect of the invention in detail with unmistakable clarity.

i) The substrate material (10) is YSZ [100] (001), the seed material (42) is YBCO [100 ] (001), and the superconducting film material (20) is YBCO oriented [100] (001) in the first region (22) and [110] (001) in the second region (24).

The method of fabricating this structure consists of growing a seed layer of YBCO [100] (001) over the first region of a substrate of YSZ [100] (001), and then growing a superconducting film of YBCO, which orients [100] (001) in the first region and [110] (001) in the second region.

In this case, it is necessary to grow the seed layer of YBCO under one set of growth conditions and the superconducting film layer of YBCO under different growth conditions in order to achieve two different crystal orientations of YBCO in contact with the same YSZ substrate. The methods of adjusting the growth conditions are known to people skilled in the art of HTS thin film deposition. YBCO is a useful seed, because when a second layer of YBCO grows on top of it, the second layer will adopt the same crystal orientation as the first layer under virtually any growth conditions.

ii) The substrate material (10) is YSZ [100] (001), the seed material (42) is YBCO [110] (001), and the superconducting film material (20) is YBCO oriented [110] (001) in the first region (22) and [100] (001) in the second region (24).

The method of fabricating this structure consists of growing a seed layer of YBCO [110] (001) over the first region of a substrate of YSZ [100] (001), and growing a superconducting film of YBCO, which orients [110] (001) in the first region and [100] (001) in the second region.

This structure is, in one sense, the reverse of the previous structure. As before, it is necessary to grow the different layers of YBCO under different growth conditions in order to achieve two different crystal orientations of YBCO on the same YSZ substrate.

iii) The substrate material (10) is YSZ [100] (001), the seed material (42) is SrTiO3, (110), and the superconducting film material (20) is YBCO oriented either (110), (103), or a mixture thereof in the first region (22) and [110] (001) in the second region (24).

In this structure, an out-of-plane weak-link grain boundary junction (30) exists in the superconducting film at the juncture between the first and second regions. (In all the other embodiments of FIG. 3 specified in this document, the junction is an in-plane weak-link grain boundary junction.)

The method of fabricating this structure consists of growing a seed layer of SrTiO$_3$ (110) over the first region of a substrate of YSZ [100] (001), and then growing a superconducting film of YBCO, which orients either (110), (103), or a mixture thereof in the first region (22) and [110] (001) in the second region (24).

iv) The substrate material (10) is selected from SrTiO$_3$ [100] (001), CaTiO$_3$ [100] (001), and LaAlO$_3$ [100] (001); the seed material (20) is YSZ [110] (001); and the superconducting film material (20) is YBCO oriented [110] (001) in the first region (22) and [100] (001) in the second region (24).

The method of fabricating this structure consists of growing a seed layer of YSZ [110] (001) over the first region of a substrate whose material is selected from SrTiO$_3$ [100] (001), CaTiO$_3$ [100] (001), and LaAlO$_3$ [100] (001), and then growing a superconducting film of YBCO, which orients [110] (001) in the first region (22) and [100] (001) in the second region (24).

FIG. 4

Another generic method of growing the superconducting film in the first region with a different crystal orientation compared to the superconducting film in the second region consists of the following steps: growing one or more seed layers over a portion of the substrate extending over the first region, growing one or more buffer layers over both the first region and the second region, and growing a superconducting film over both the first region and the second region. This strategy yields the structure shown in FIG. 4.

Figure 4:
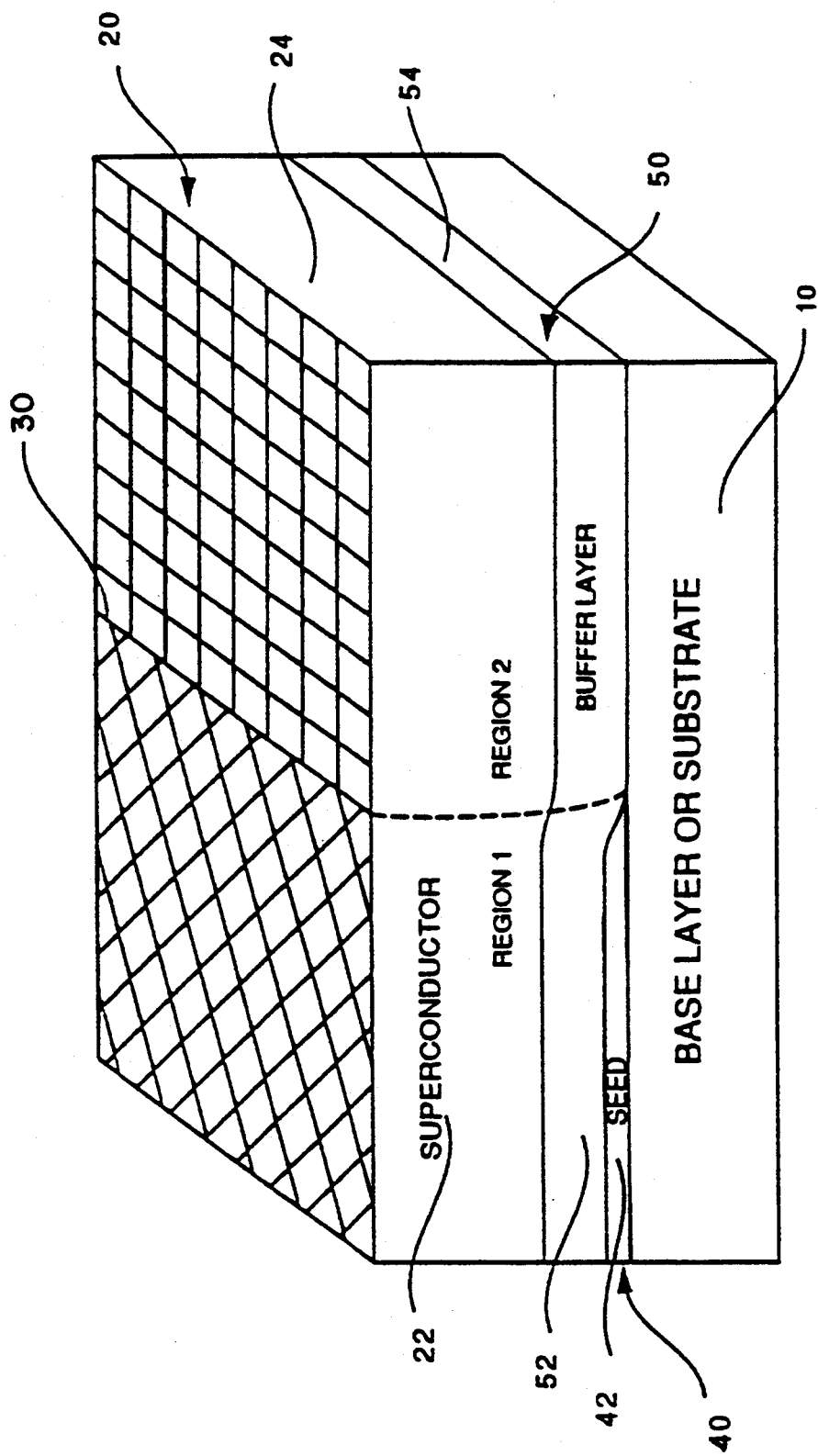
FIG. 4 is a schematic perspective representation of a structure containing a substrate, a seed layer overlying the substrate in the first region, a buffer layer overlying the first and second regions, and a superconducting film overlying the first and second regions.

In FIG. 4, the lowest stratum is a substrate (10). The next stratum consists of one or more seed layers (40) which extend over a portion of the substrate in the first region. The next stratum consists of one or more buffer layers (50)[, labeled "Buffer" (52) and "Buffer'" (54)], which have one orientation (52) in the first region and a different orientation (54) in the second region. The uppermost stratum is a superconducting film (20), which extends over both the first region and the second region. The superconducting film has grown with one orientation (22) in the first region and a second orientation (24) in the second region. As a result, a weak-link grain boundary junction (30) exists in the superconducting film at the juncture between the first region and the second region.

The buffer layer (50) can consist of materials which provide an intermediate lattice match between the layers above and below. The purpose of this strategy is to minimize stress, cracking, and defect structures in the weak-link grain boundary junction or the superconducting films.

We will describe five different embodiments of the structure shown in FIG. 4 and the methods of fabricating them. In all these embodiments, the superconducting film material is arbitrarily chosen to be YBCO. The YBCO grows with two different orientations, and a 45° weak-link in-plane grain boundary junction exists in the superconducting film at the juncture between the first region and the second region.

i) The material of the substrate (10) is r-plane Al$_2$O$_3$ [$\bar{2}$021] (1$\bar{1}$02). The material of the seed layer (40) is MgO [110] (001). The material of the buffer layer (50) is SrTiO$_3$, oriented [110] (001) in the first region (52) and [100] (001) in the second region (54). The material of the superconducting film (20) is YBCO, oriented [110] (001) in the first region (22) and [100] (001) in the second region (24). The method of fabricating this structure consists of growing a seed layer of MgO [110] (001) over the first region of a substrate of r-plane Al$_2$O$_3$ [$\bar{2}$021] (1$\bar{1}$02), growing a buffer layer of SrTiO$_3$, which orients [110] (001) in the first region and [100] (001) in the second region, and then growing a superconducting film of YBCO, which orients [110] (001) in the first region and [100] (001) in the second region.

ii) The material of the substrate (10) is r-plane Al$_2$O$_3$ [$\bar{2}$021] (1$\bar{1}$02). The material of the seed layer (40) is SrTiO$_3$ [100] (001). The materials of the buffer layer (50) are a layer of MgO, oriented [100] (001) in the first region (52) and [110] (001) in the second region (54), followed by a layer of SrTiO$_3$ (not explicitly shown), also oriented [100] (001) in the first region and [110] (001) in the second region. The material of the superconducting film (20) is YBCO oriented [100] (001) in the first region (22) and [110] (001) in the second region (24).

The method of fabricating this structure consists of growing a seed layer of SrTiO$_3$ [100] (001) over the first region of a substrate of r-plane Al$_2$O$_3$ [$\bar{2}$021] (1$\bar{1}$02), growing a layer of MgO, oriented [100] (001) in the first region and [110] (001) in the second region, followed by a layer of SrTiO$_3$, also oriented [100] (001) in the first region and [110] (001) in the second region, and then growing a superconducting film of YBCO, which orients [100] (001) in the first region (22) and [110] (001) in the second region (24).

iii) The material of the substrate (10) is r-plane Al$_2$O$_3$ [$\bar{2}$021] (1$\bar{1}$02). The material of the seed layer (40) is MgO [100] (001). The material of the buffer layer (50) is selected from LaAlO$_3$, SrTiO$_3$, and CaTiO$_3$, oriented [110] (001) in the first region (52) and [100] (001) in the second region (54). The material of the superconducting film (20) is YBCO oriented [110] (001) in the first region (22) and [100] (001) in the second region (24).

The method of fabricating this structure consists of growing a seed layer of MgO [110] (001) over the first region of a substrate of r-plane Al$_2$O$_3$ [$\bar{2}$021] (1$\bar{1}$02); growing one or more buffer layers, selected from LaAlO$_3$, SrTiO$_3$, and CaTiO$_3$, which orient [110] (001) in the first region and [100] (001) in the second region; and growing a superconducting film of YBCO, which orients [110] (001) in the first region (22) and [100] (001) in the second region (24).

iv) The material of the substrate (10) is r-plane Al$_2$O$_3$ [$\bar{2}$021] (1$\bar{1}$02). The material of the seed layer (40) is selected from SrTiO$_3$ [100] (001) and CaTiO$_3$ [100] (001). The material of the buffer layer (50) is MgO oriented [100] (001) in the first region and [110] (001) in the second region. The superconducting film (20) is YBCO oriented [100] (001) in the first region (22) and [110] (001) in the second region (24).

The method of fabricating this structure consists of growing a seed layer, whose material is selected from SrTiO$_3$ [100] (001) or CaTiO$_3$ [100] (001), over the first region of a substrate of r-plane Al$_2$O$_3$ [$\bar{2}$021] (1$\bar{1}$02);

growing a buffer layer of MgO, which orients [100] (001) in the first region and [110] (001) in the second region; and then growing a superconducting film of YBCO, which orients [100] (001) in the first region (22) and [110] (001) in the second region (24).

v) The material of the substrate (10) is r-plane $Al_2O_3$ [$\bar{2}021$] ($1\bar{1}02$). The material of the seed layer (40) is YSZ (001). The material of the buffer layer (50) is SrTiO$_3$, oriented (110) in the first region (52) and (001) in the second region (54). The material of the superconducting film (20) is YBCO oriented either (110), (103), or a mixture thereof in the first region (22) and (001) in the second region (24).

The method of fabricating this structure consists of growing a seed layer of YSZ (001) in the first region of a substrate of r-plane $Al_2O_3$ [$\bar{2}021$] ($1\bar{1}02$), growing a buffer layer of SrTiO$_3$, which orients (110) in the first region (52) and (001) in the second region (54), and growing a superconducting film of YBCO, which orients either (110), (103) or a mixture thereof in the first region (22) and (001) in the second region (24).

FIG. 5

Still another generic method of growing the superconducting film in the first region with a different crystal orientation compared to the superconducting film in the second region consists of the following steps: growing one or more seed layers and one or more buffer layers over a portion of the substrate which extends over the first region, then growing one or more buffer layers over both the first region and the second region, and finally growing a superconducting film over both the first region and the second region. This strategy yields the structure shown in FIG. 5.

Figure 5:
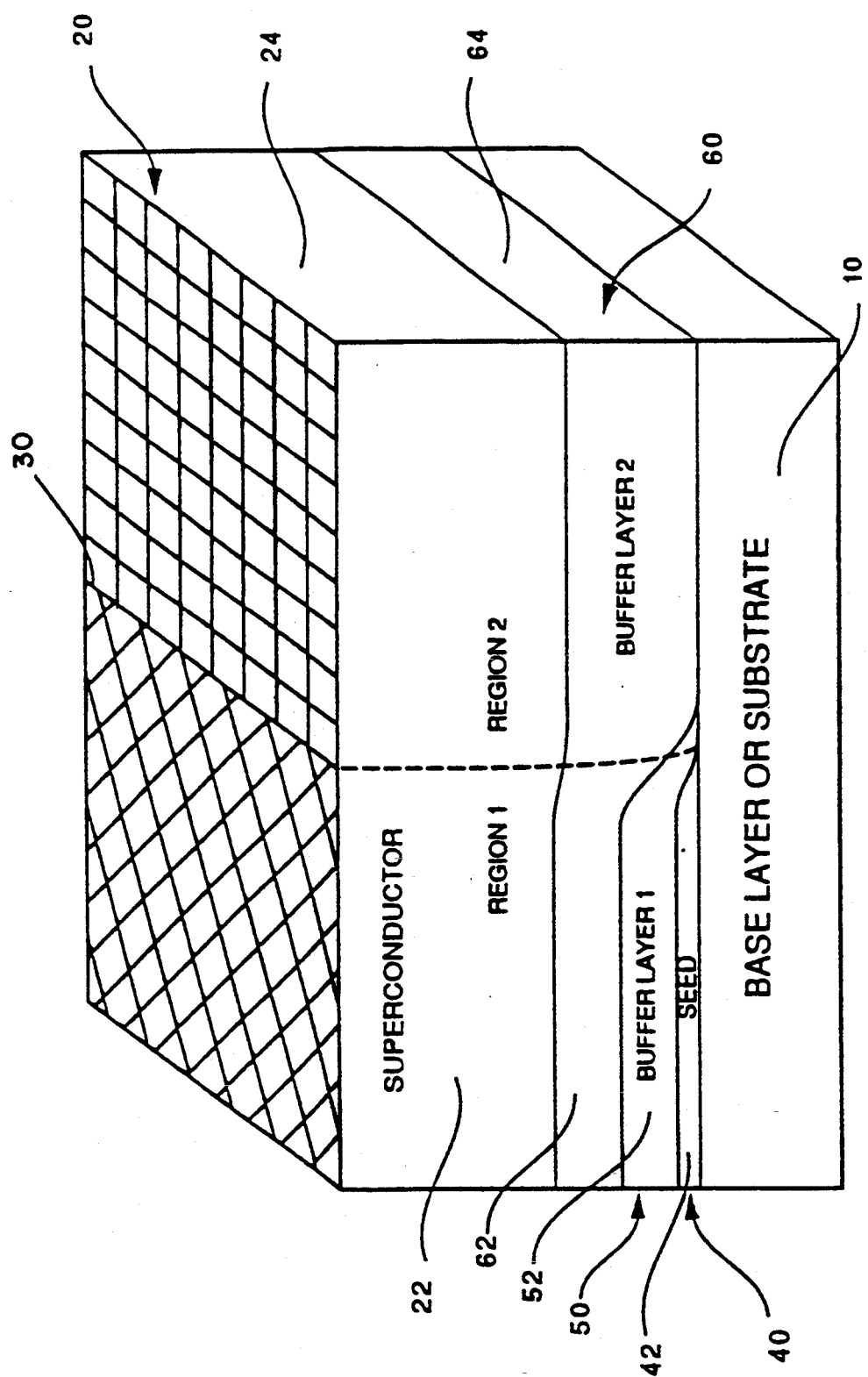
FIG. 5 is a schematic perspective representation of a structure containing a substrate, a seed layer overlying the substrate in the first region, a buffer layer overlying the seed layer in the first region, a second buffer layer overlying the first and second regions, and a superconducting film overlying both regions.

In FIG. 5, the lowest stratum is a substrate (10). The next stratum consists of one or more seed layers (40) and one or more buffer layers (50) which extend over a portion of the substrate in the first region (52). (This buffer layer (50) is useful for protecting a seed layer during processing.) The next stratum consists of one or more buffer layers (60) which grow with one orientation in the first region (62) and with a different orientation in the second region (64). The uppermost stratum is a superconducting film (20), which extends over both the first region and the second region. The superconducting film has grown with one orientation (22) in the first region and a second orientation (24) in the second region. As a result, a weak-link grain boundary junction (30) exists in the superconducting film at the juncture between the first region and the second region.

We will describe two different embodiments of the structure shown in FIG. 5 and the methods of fabricating them. Once again, in all these embodiments of FIG. 5 the superconducting film material is arbitrarily chosen to be YBCO, the YBCO grows with two different orientations, and a 45° weak-link in-plane grain boundary junction exists in the superconducting film at the juncture between the first region and the second region.

i) The material of the substrate (10) is r-plane $Al_2O_3$ [$\bar{2}021$] ($1\bar{1}02$). The material of the seed layer (40) is MgO [110] (001). The material of the first buffer layer (50) is SrTiO$_3$ [110] (001). The material of the next buffer layer (60) is SrTiO$_3$, oriented [110] (001) in the first region (62) and [100] (001) in the second region (64). The material of the superconducting film (20) is YBCO oriented [110] (001) in the first region (22) and [100] (001) in the second region (24).

The method of fabricating this structure consists of growing a seed layer of MgO [110] (001) and a buffer layer of SrTiO$_3$ [110] (001) over the first region of a substrate of r-plane $Al_2O_3$ [$\bar{2}021$] ($1\bar{1}02$); growing a buffer layer of SrTiO$_3$, which orients [110] (001) in the first region and [100] (001) in the second region; and then growing a superconducting film of YBCO, which orients [110] (001) in the first region and [100] (001) in the second region.

ii) The material of the substrate (10) is r-plane $Al_2O_3$ [$\bar{2}021$] ($1\bar{1}02$). The material of the seed layer (40) is MgO [110] (001). The material of the buffer layer (50) is SrTiO$_3$ [110] (001). The materials of the buffer layers (60) are selected from among LaAlO$_3$, SrTiO$_3$, and CaTiO$_3$, oriented [110] (001) in the first region (62) and [110] (001) in the second region (64). The material of the superconducting film (20) is YBCO, oriented [110] (001) in the first region (22) and [100] (001) in the second region (24).

The method of fabricating this structure consists of growing a seed layer of MgO [110] (001) and a buffer layer of SrTiO$_3$ [110] (001) over the first region of a substrate of r-plane $Al_2O_3$ [$\bar{2}021$] ($1\bar{1}02$); growing one or more buffer layers selected from LaAlO$_3$, SrTiO$_3$, and CaTiO$_3$, which orient [110] (001) in the first region and [100] (001) in the second region; and then growing a superconducting film of YBCO, which orients [110] (001) in the first region and [100] (001) in the second region.

FIG. 6

Yet another generic method of growing the superconducting film in the first region with a different crystal orientation compared to the superconducting film in the second region consists of the following steps: growing one or more buffer layers which extend over both the first region and the second region of a substrate, growing one or more seed layers which extend over only the first region, and growing a superconducting film over both the first region and the second region. This strategy yields the structure shown in FIG. 6. This method is especially useful for growing on chemically reactive substrates.

Figure 6:
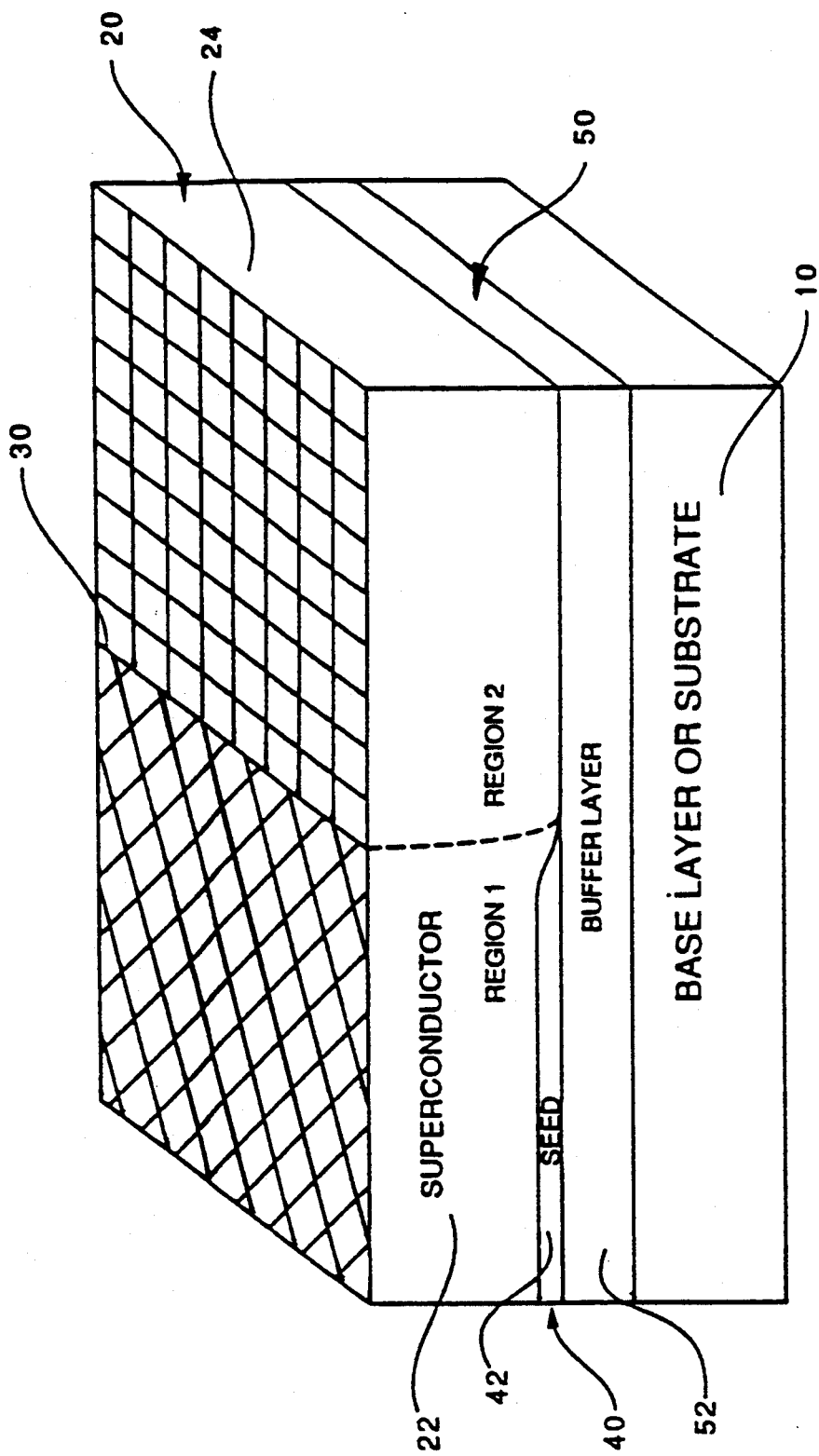
FIG. 6 is a schematic perspective representation of a structure containing a substrate, a buffer layer, a seed layer overlying the first region, and a superconducting film overlying the first and second regions.

In FIG. 6, the lowest stratum is a substrate (10). The next stratum consists of one or more buffer layers (50) which extend over both the first region and the second region. The next stratum consists of one or more seed layers (40) which extend over the first region. The uppermost stratum consists of a superconducting film (20), which extends over both the first region and the second region. The superconducting film has grown with one orientation (22) in the first region and a second orientation (24) in the second region. As a result, a weak-link grain boundary junction (30) exists in the superconducting film at the juncture between the first region and the second region.

FIG. 7

Yet another generic method of growing the superconducting film in the first region with a different crystal orientation compared to the superconducting film in the second region consists of the following steps: growing one or more buffer layers which extend over both the first region and the second region of a substrate, growing one or more seed layers which extend over only the first region, growing one or more buffer layers which extend over both the first and second regions, and growing a superconducting film over both the first region and the second region. This strategy yields the structure shown in FIG. 7.

Figure 7:
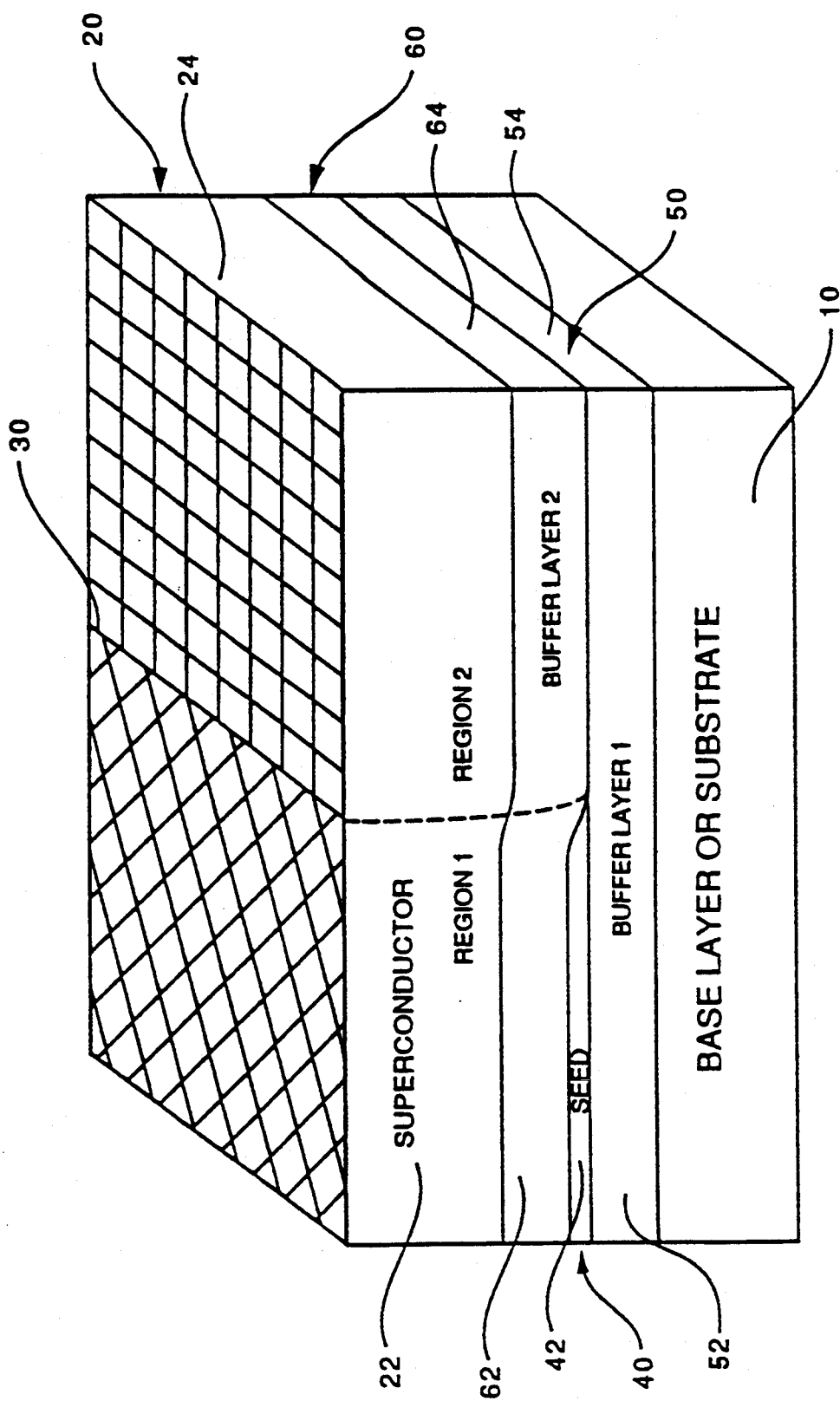
FIG. 7 is a schematic perspective representation of a structure containing a substrate, a buffer layer, a sloped seed layer overlying the first region, a buffer layer overlying the first and second regions, and a superconducting film overlying the first and second regions.

In FIG. 7, the lowest stratum is a substrate (10). The next stratum consists of one or more buffer layers (50) which extend over both the first region and the second region. The next stratum consists of one or more seed layers (40) which extend over the first region. The next stratum consists of one or more buffer layers (60) which extend over both the first region and the second region, adopting one orientation in the first region (62) and a different orientation in the second region (64). The uppermost layer (20) is a superconducting film which extends over both the first region and the second region. The superconducting film has grown with one orientation (22) in the first region and a second orientation (24) in the second region. As a result, a weak-link grain boundary junction (30) exists in the superconducting film at the juncture between the first region and the second region.

FIG. 8

Still another generic method of growing the superconducting film in the first region with a different crystal orientation compared to the superconducting film in the second region consists of the following steps: growing onto a substrate one or more seed layers which extend over the first region and one or more seed layers which extend over the second region, and growing a superconducting film over both the first region and the second region. This strategy yields the structure shown in FIG. 8.

Figure 8:
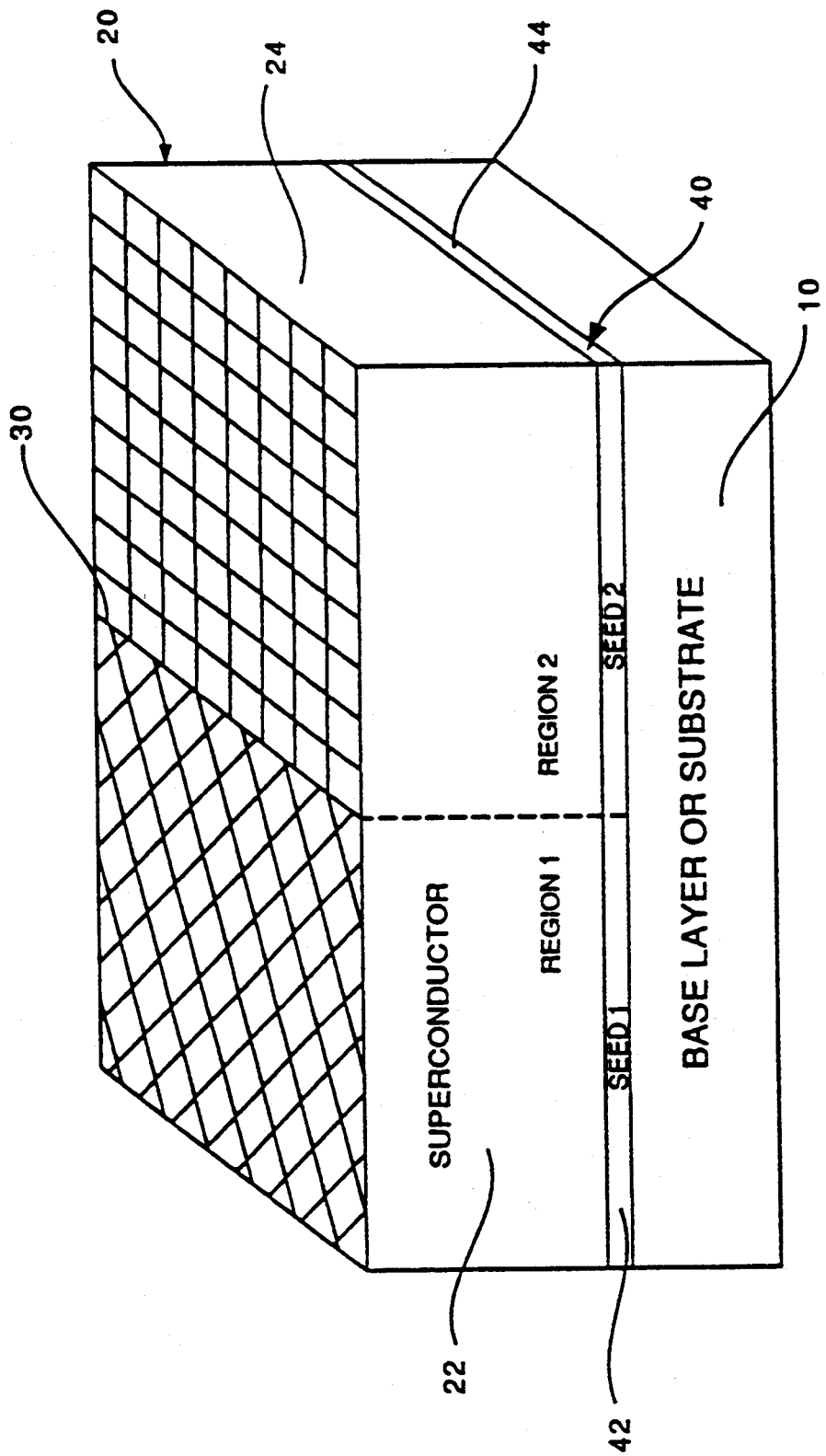
FIG. 8 is a schematic perspective representation of a structure containing a substrate, a seed layer overlying the first region, a second seed layer overlying the second region, and a superconducting film overlying the first and second regions.

In FIG. 8, the lowest stratum is a substrate (10). The next stratum is a composite stratum (40), in which one or more seed layers (42) extend over the first region and one more seed layers (44) extend over the second region. The uppermost stratum is a superconducting film (20) which extends over both the first region and the second region. The superconducting film has grown with one orientation (22) in the first region and a second orientation (24) in the second region. As a result, a weak-link grain boundary junction (30) exists in the superconducting film at the juncture between the first region and the second region.

We will cite one specific embodiment of the structure shown in FIG. 8. The material of the substrate (10) is YSZ [100] (001). The next stratum is a composite stratum (40) in which the material of the seed layer (42) which extends over the first region is YBCO [100] (001), and the material of the seed layer (44) which extends over the second region is YBCO [110] (001). The material of the superconducting film (20) is YBCO oriented [110] (001) in the first region (22) and [100] (001) in the second region (24). A 45° in-plane weak-link grain boundary junction (30) exists at the juncture between the first and second regions.

The method of fabricating this structure consists of the following steps: growing onto a substrate of YSZ [100] (001) a seed layer of YBCO [100] (001) which extends over the first region and a seed layer of YBCO [110] (001) which extends over the second region, and then growing over both a superconducting film of YBCO, which orients [110] (001) in the first region and [100] (001) in the second region.

FIG. 9

Still another generic method of growing the superconducting film in the first region with a different crystal orientation compared to the superconducting film in the second region consists of the following steps: growing onto a substrate one or more seed layers which extend over the first region and one or more seed layers which extend over the second region, growing one or more buffer layers which extend over both the first and second regions, and growing a superconducting film over both the first region and the second region. This strategy yields the structure shown in FIG. 9.

Figure 9:
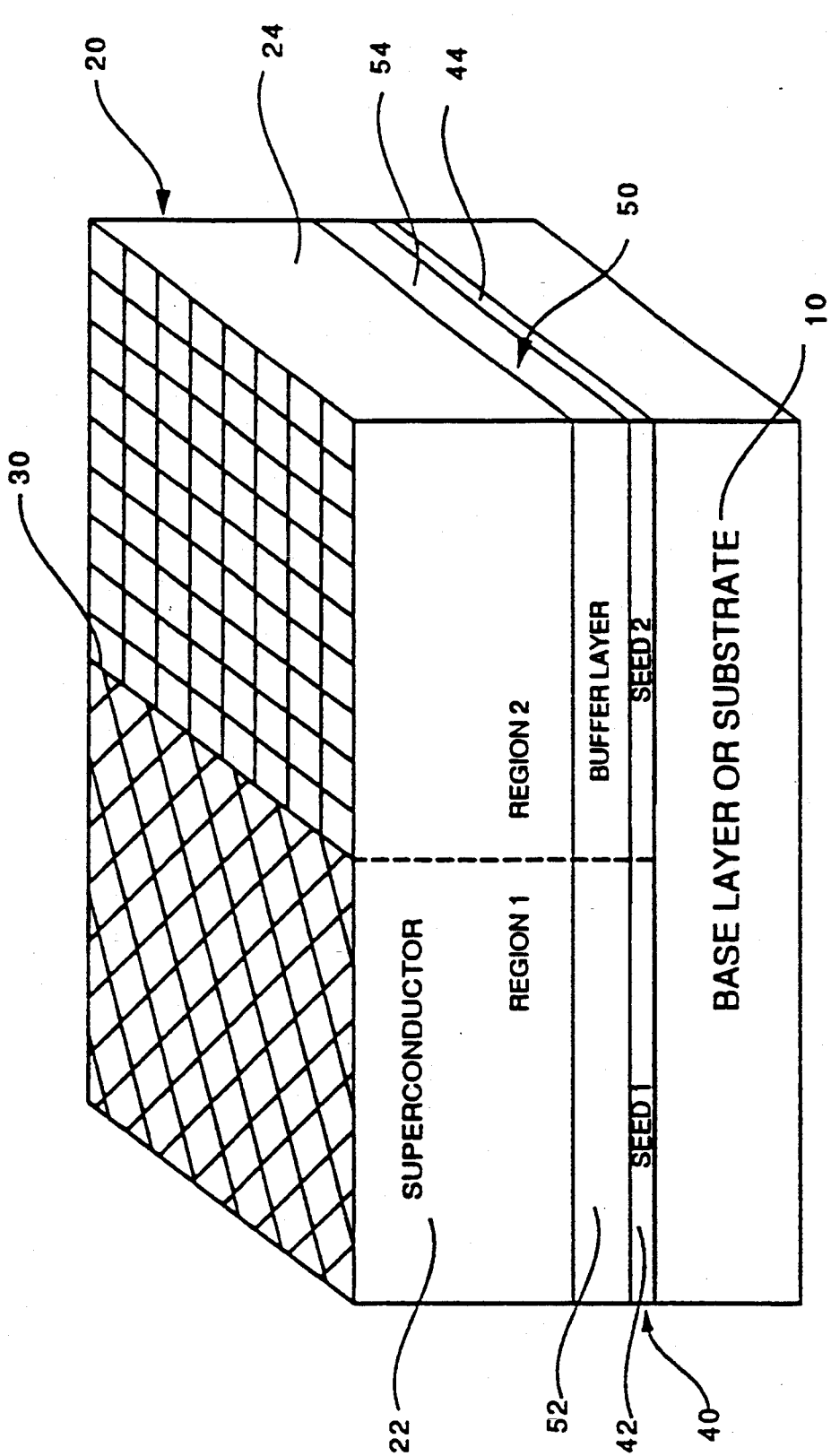
FIG. 9 is a schematic perspective representation of a structure containing a substrate, a seed layer overlying the first region, a second seed layer overlying the second region, a buffer layer overlying the first and second regions, and a superconducting film overlying the first and second regions.

In FIG. 9 the lowest stratum (10) is a substrate. The next stratum is a composite stratum (40) in which one more seed layers (42) extend over the first region and one or more seed layers (44) extend over the second region. The next stratum consists of one or more buffer layers (50) which extend over both the first region and the second region. The uppermost stratum is a superconducting film (20) which extends over both the first region and the second region. A weak-link grain boundary junction (30) exists in the superconducting film at the juncture between the first and second regions.

We will cite one specific example of the structure shown in FIG. 9. The material of the substrate (10) is YSZ [100] (001). The material of the seed layer (42) which extends over the first region is YBCO [100] (001). The material of the seed layer (44) which extends over the second region is YBCO [110] (001). The material of the buffer layer (50) is SrTiO$_3$, oriented [100] (001) in the first region (52) and [110] (001) in the second region (54). The material of the superconducting film (20) is YBCO oriented [100] (001) in the first region and [110] (001) in the second region. A 45° in-plane weak-link grain boundary junction (30) exists in the superconducting film at the juncture between the first region (22) and the second region (24).

The method of fabricating this structure consists of the following steps: growing onto a substrate of YSZ [100] (001) a seed layer of YBCO [100] (001) which extends over the first region and a seed layer of YBCO [110] (001) which extends over the second region, then growing a buffer layer of SrTiO$_3$, which orients [100] (001) in the first region and [110] (001) in the second region, and finally growing a superconducting film of YBCO, which orients [100] (001) in the first region and [110] (001) in the second region.

FIG. 10

We offer yet another generic method of growing the superconducting film in the first region with a different crystal orientation compared to the superconducting film in the second region: growing onto a substrate one or more buffer layers which extend over both the first region and the second region, growing one or more seed layers which extend over the first region and one or more seed layers which extend over the second region, growing one or more buffer layers which extend over both the first and second regions, and growing a superconducting film over both the first region and the second region. This strategy yields the structure shown in FIG. 10.

Figure 10:
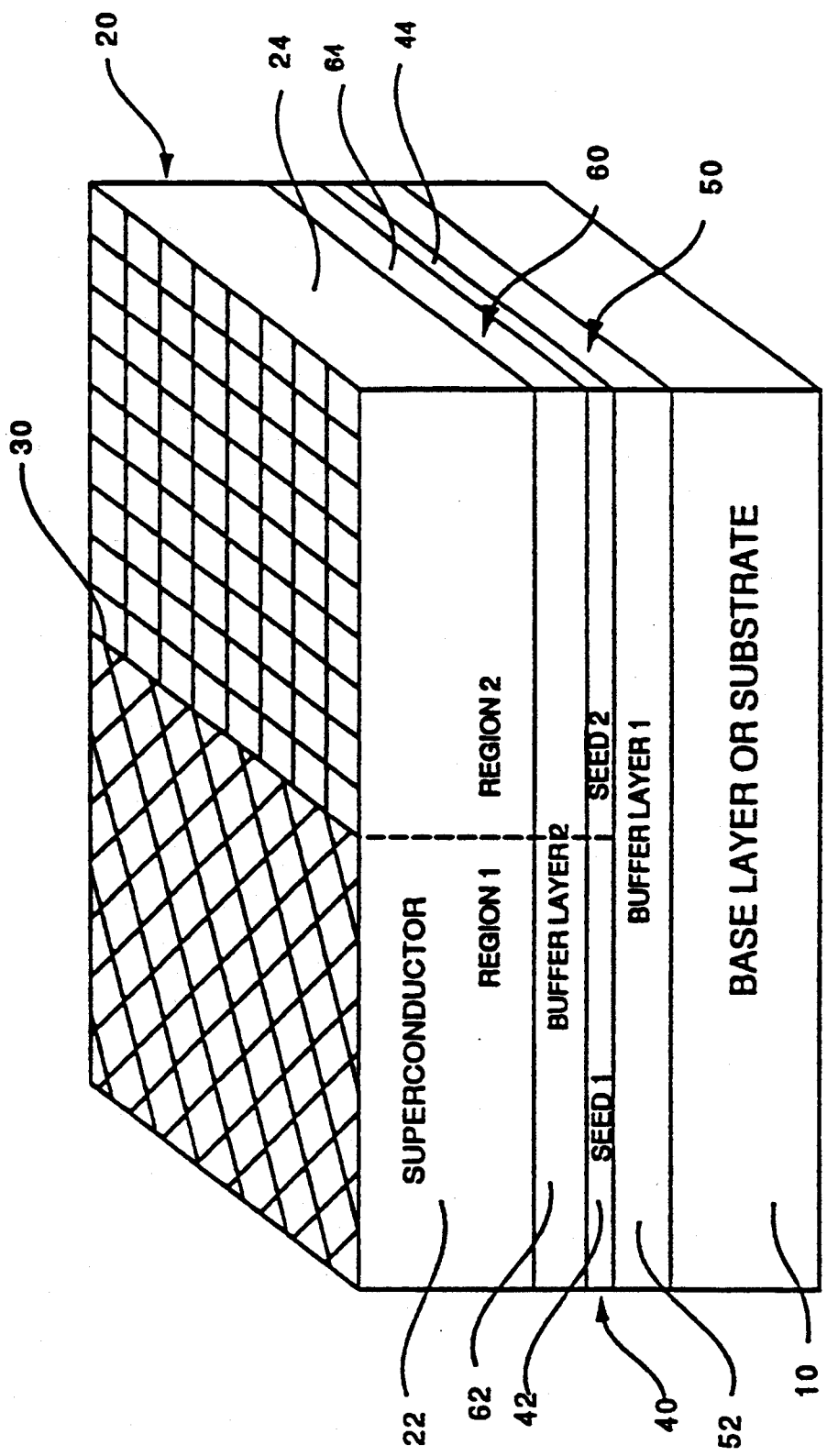
FIG. 10 is a schematic perspective representation of a structure containing a substrate, a buffer layer, a seed layer overlying the first region, a second seed layer overlying the second region, another buffer layer overlying the first and second regions, and a superconducting film overlying the first and second regions.

In FIG. 10, the lowest stratum is a substrate (10). The next stratum consists of one or more buffer layers (50) which extend over both the first region and the second region. The next stratum is a composite stratum (40) in which one or more seed layers (42) extend over the first region and one or more seed layers (44) extend over the second region. The next stratum consists of one or more buffer layers (60) which extend over both the first region and the second region. The uppermost stratum is a superconducting film (20) which extends over both the first region and the second region. A 45° weak-link grain boundary junction (30) exists at the juncture between the first and second regions.

We have listed several examples of structures which can be grown by combinations of seed layers and buffer layers. The number of possible structures which will create weak-link grain boundary junctions is obviously very large; the examples we have cited are meant to be illustrative rather than comprehensive.

Electrical Characteristics

Figure 11:
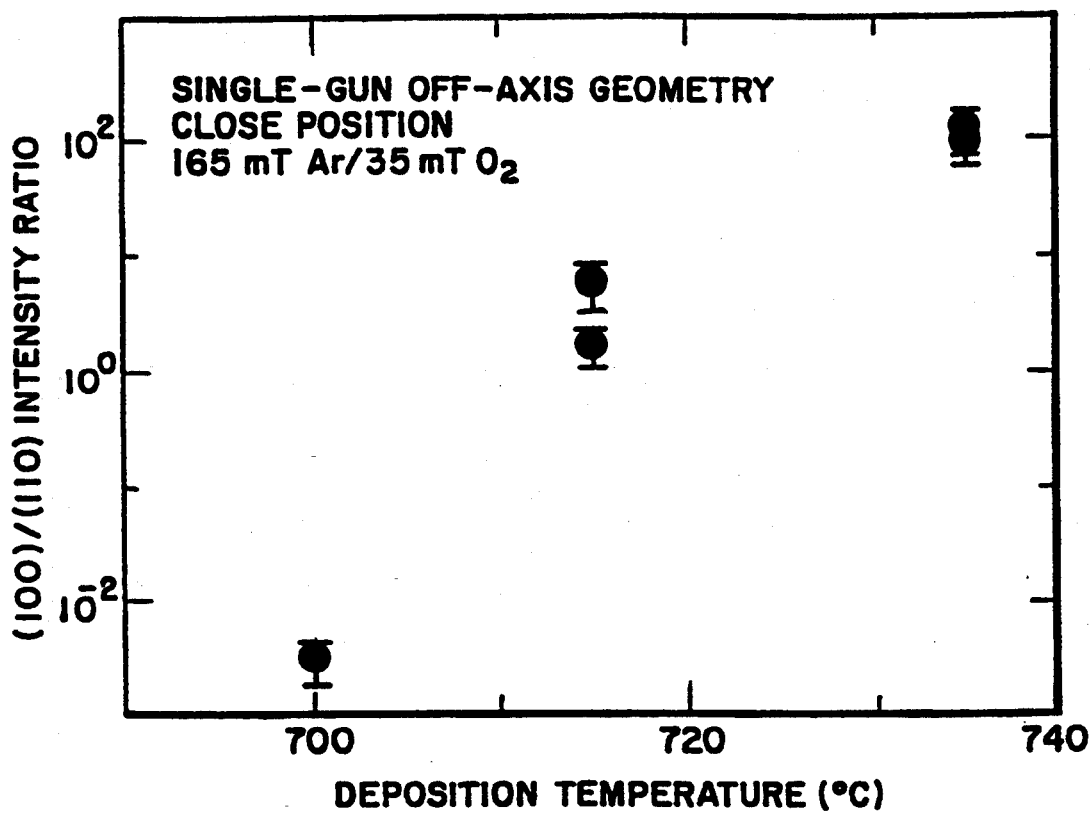
FIG. 11 is a plot of relative crystalline orientation versus film growth temperature for YBCO grown on a YSZ substrate, illustrating the effect of processing conditions on crystaline orientation.

In order to fabricate some of these structures, it is necessary to have an understanding of how processing conditions affect crystalline orientation. We have developed this capability for the materials discussed above, and present an example of how film growth temperature affects the orientation of YBCO films grown on YSZ substrates. FIG. 11 shows how a 40° C. change in film growth temperature can induce two completely different in-plane crystalline orientations with respect to the YSZ substrate.

Figure 12:
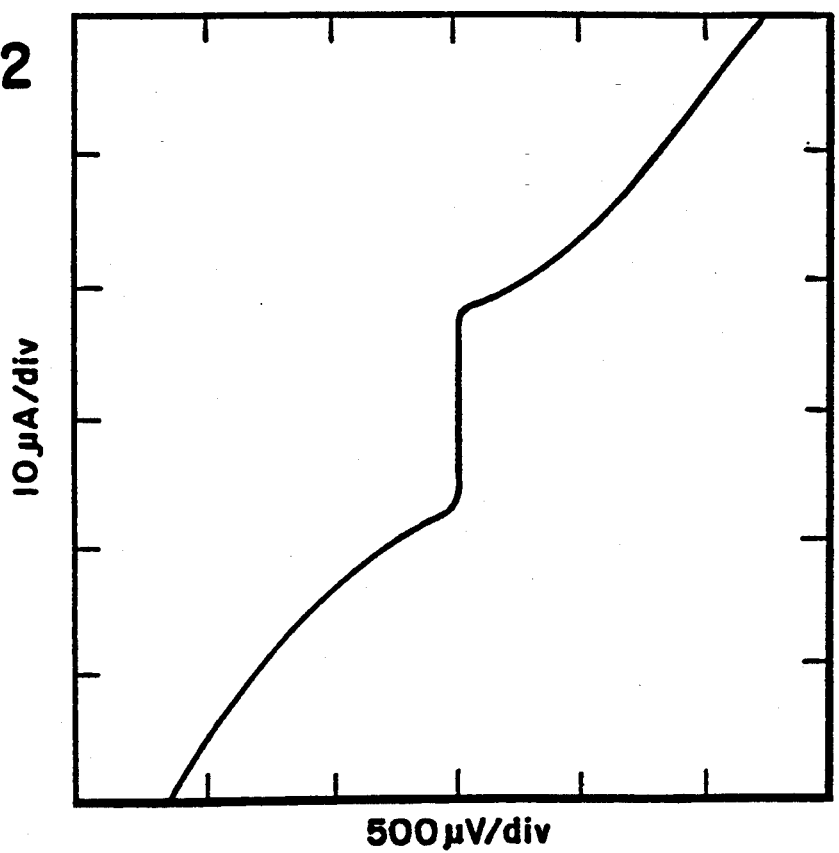
FIG. 12 is a current-voltage (I-V) plot for a weak-link grain boundary junction of the type shown in FIG. 4.

FIG. 12 shows the I-V characteristics of a patterned YBCO line that contains a grain boundary junction of the type shown in FIG. 4 with the materials specified in subsection i). This figure illustrates that the weak link grain boundary junctions have desirable I-V characteristics.

Figure 13:
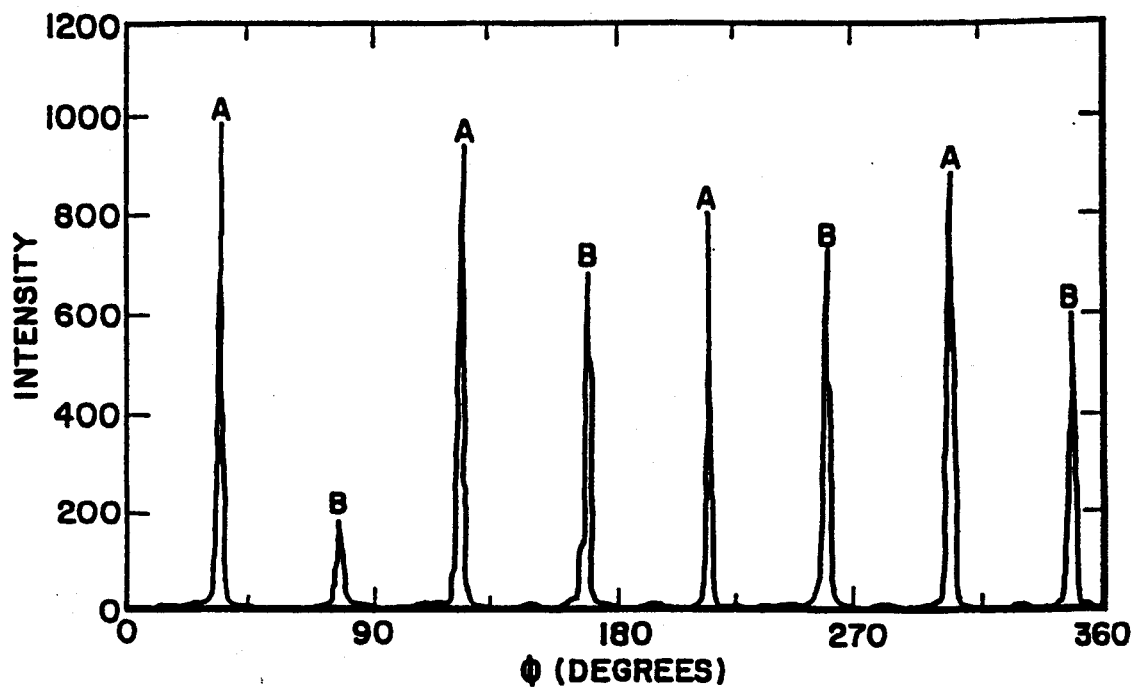
FIG. 13 is an x-ray $\psi$ scan of the structure seen in FIG. 4.

FIG. 13 shows an X-ray $\psi$ scan (YBCO (103) peaks) of the structure shown in FIG. 4 with the materials specified in subsection i). The B peaks are due to in-plane epitaxy of the $YBCO/SrTiO_3/Al_2O_3$ multilayer region. The 4 peaks labeled "A" are due to the $YBCO/SrTiO_3/MgO/Al_2O_3$ regions of the bicrystal which are rotated 45° with respect to the B peaks. This X-ray scan demonstrates that a 45° in-plane weak-link grain boundary junction has been created through standard lithographic techniques.

Figure 14:
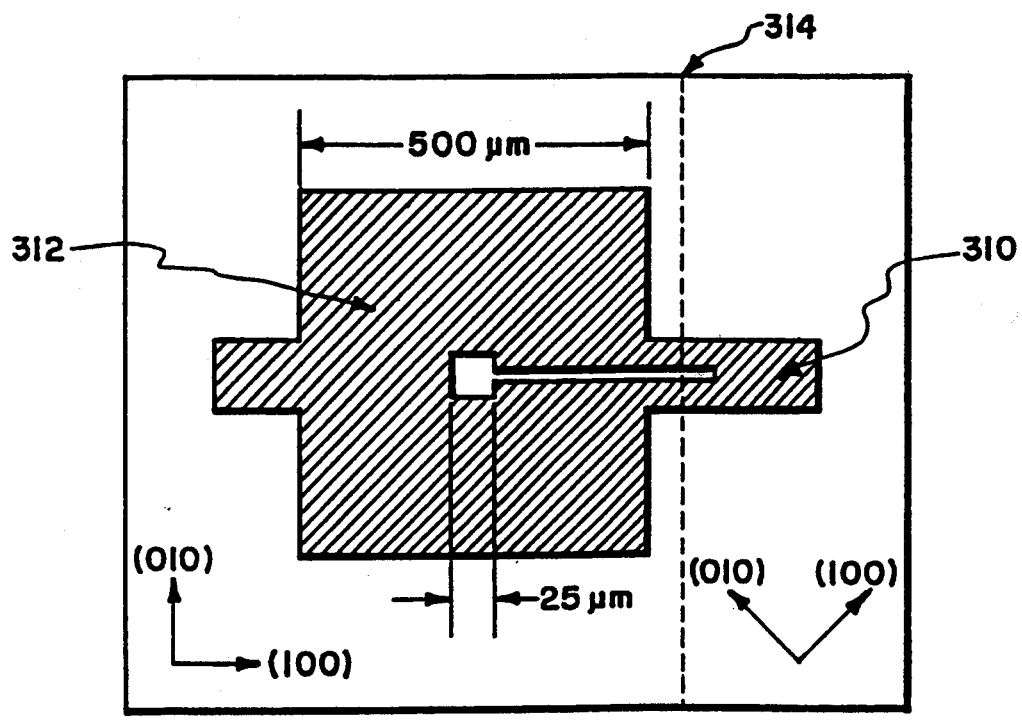
FIG. 14 is a schematic diagram of a SQUID employing weak-link grain boundary junctions of the type described in this document.

FIG. 14 illustrates a dc SQUID, one of the many possible superconducting device structures that can be fabricated by this technique. It shows a dc SQUID, in a square washer configuration, fabricated from a superconducting film of YBCO which contains two weak link grain boundary junctions. The line (314) which defines the grain boundary between the regions (310, 312) can be utilized to pattern a plurality of SQUIDs along the same line. Furthermore, other lines parallel or perpendicular to the first line can be defined by means of combined growth and lithographic steps. SQUIDs could be interconnected into an array. The resolution and packing density are much higher and more easily achieved than any weak-link structures one could fabricate with technology based on the prior art.

Figure 15:
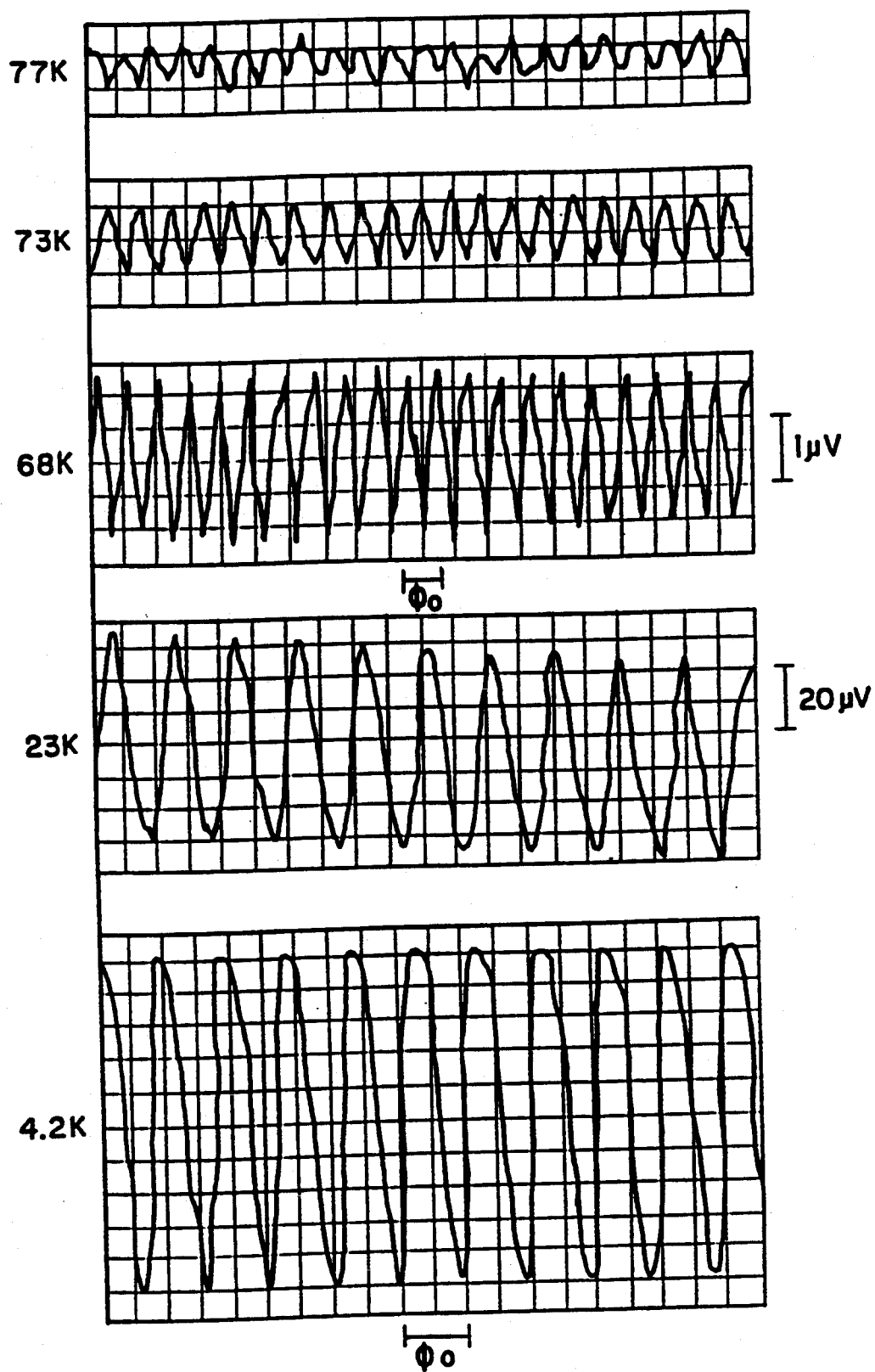
FIG. 15 is a plot of SQUID voltage versus magnetic field (V-phi), showing the output from the device described in FIG. 14. $F_0$ refers to a single fluxon of magnetic field.

FIG. 15 illustrates the modulation of voltage across the SQUID as a function of applied magnetic field. This modulation confirms that the weak link junctions operate properly in a SQUID at temperatures ranging from 4K to 77K.

In order to fabricate these structures, one employs standard crystal growth techniques commonly used in semiconductor and high temperature superconductor processing. Growth of the intermediate layers and of the superconductor layers may be accomplished by any crystal growth technique which can produce high quality films of complex materials. Laser ablation, sputtering, and metal-organic chemical vapor deposition (MOCVD) can all be used to grow layers of insulators, semiconductors, metals, and superconductors on substrates or previously grown layers of the same or other materials. Any one of these techniques will produce the structures described above.

In order to achieve a seed layer that covers only the first region of the substrate it is currently most effective to deposit the seed layer across all regions of the substrate or base layer and then follow the deposition with a patterning step. During the patterning step the seed layer is removed from areas which will become the second region. The borders between the areas in which the seed material which remains and the areas in which the seed material has been removed are the locations of the grain boundaries between the two regions which function as weak-link Josephson junctions.

After growth of the seed layer the substrate may be removed from the growth chamber and subjected to patterning by photolithographic techniques. The pattern defined in a protective layer by the lithography can be transferred to the seed layer by wet chemical etching, by dry etching, or by other techniques including ion implantation and direct writing.

Wet chemical processing, or etching, includes subjecting the patterned protective coating along with the unprotected areas of the substrate or subsequently grown layers to liquids which affect the surface of the unprotected areas. These liquids may include acids, bases, and organic solvents which alter the chemical characteristics of the surface of the material to be patterned on contact.

Dry processing, or etching, involves altering the characteristics of the surface of the material to be patterned. This may be accomplished by reactive ion etching, by sputtering, by erosion in a plasma, or by any other physical or chemical means which alters the chemical or physical properties of the surface under attack and which does not subject that surface to contact with a liquid.

Other methods of transferring the desired pattern to the exposed, or unprotected, areas of the substrate or subsequently grown material include: implanting the sample with ions of a species foreign to the material in the layer or layers to be patterned, implanting it with ions which are native to the material in the layer or layers to be patterned, diffusing foreign or native species into the layer in the exposed regions, or allowing volatile species to diffuse out of the layer or layers. All of these methods of transferring a desired patterned onto a material are well known, and do not form a part of the invention, although such steps may be necessary to the production of the invention.

The goal of the above steps is to produce a structure in which the seed layer remains only in the desired regions of the substrate. Thus it follows that other techniques that deposit and remove the seed layer material in the appropriate regions, or that accomplish the deposition of the seed layer material only in the desired regions, now known or discovered in the future, may be used in the execution of these process steps.

The growth-of the two distinct regions of superconducting film can again be effected by several techniques common to high temperature superconductor processing, as long as the seed layer in the first region causes growth to proceed with a different crystallographic orientation from that found in the second region. These techniques include, but are not limited to, laser ablation, sputtering, electron beam evaporation, and chemical vapor depostion.

Best Mode

The best mode that the inventors currently envision of implementing their invention is described below. It should be recognized that the exact choice of materials, deposition and patterning methods, and process parameters used in this example do not limit the applicability or usefulness of the invention. It should also be recognized that, while this is the best mode currently envisioned, another mode of operation may be found to produce improved results after further experimentation.

A (100) oriented single crystal substrate of yttria-stabilized zirconia is cleaned with organic solvents and is blown dry with dry nitrogen. The substrate is chosen to have a manageable thickness, typically from 10 to 30 mils, 250 to 750 micrometers. The substrate is then affixed to a substrate heater with silver paste which has been smoothed into a thin layer between the substrate heater and the substrate. The substrate heater can be one of several commercially available models and is chosen for its compatibility with a high-temperature, highly oxidizing environment as is routinely encountered during the growth of high temperature superconductors.

The substrate and substrate heater are heated slowly to several hundred degrees centigrade to allow the organic binder in the silver paste to decompose and evolve slowly from the region between the substrate and the substrate heater. It is well known that good thermal contact between the substrate and the substrate heater is essential to the maintenance of a uniform environment across the surface of the substrate during growth. The slow heating allows the organic material to evolve slowly and reduces the probability that large gas bubbles will form between the substrate and the substrate heater. Such bubbles have a detrimental effect on the thermal contact between the substrate and the substrate heater and may even lead to delamination of the substrate.

The substrate heater, with the substrate now firmly attached with silver, is loaded into a growth chamber and is affixed to a heater mounting block. The heater leads are electrically connected to a heater power supply and a thermocouple is positioned near the surface of the substrate heater. In the current configuration in our laboratory this is accomplished by placing the thermocouple into a hole in the side of the substrate heater that extends toward the center of the substrate heater just under its surface.

The ensemble is heated to 450° C. in room air. The growth chamber is then evacuated and is backfilled with oxygen to a pressure of approximately 100 mTorr. The substrate is then heated to approximately 78020 C. and a buffer layer of $CeO_2$ is deposited by laser deposition. The 248 nm line of a Lambda Physik KrF excimer laser pulsed 10 times per second (a frequency of 10 Hz) with a nominal energy density of $2J/cm^2$ is allowed to ablate material from an essentially stoichiometric target for approximately 20 seconds in order to deposit approximately 10 nm of $CeO_2$ onto the substrate.

The pressure is increased to approximately 400 mTorr of $O_2$ for the deposition of another buffer layer. Approximately 10 nm of $PrBa_2Cu_3O_7$ is deposited by directing the same laser at an energy of $2J/cm^2$ at a target of $PrBa_2Cu_3O_7$ for 20 seconds. After this deposition, the pressure is reduced to approximately 100 mTorr and the temperature of the substrate is reduced to approximately 760° C. A buffer layer of $SrTiO_3$ approximately 100 nm thick is deposited from a stoichiometric target with a laser energy of $2J/cm^2$ and a deposition time of 2 minutes.

Next the seed layer is grown. The seed material, MgO, is deposited at 500°C., 5 mTorr of $O_2$, $3J/cm^2$ and a deposition time of 3 minutes, yielding a layer thickness of approximately 10 nm. A protective buffer layer of $CeO_2$ is deposited atop the seed at 810° C., 100 mTorr of $O_2$, $2J/cm^2$ and a deposition time of 20 seconds, yielding a layer thickness of approximately 10 nm. The structure is cooled to room temperature in approximately 600 mTorr of $O_2$ at a rate of about 45° C./minute. This completes the formation of layers 50, 40, and 60 atop the substrate 10 as seen in FIG. 7.

The structure is removed from the growth chamber after cooling to a manageable temperature, substantially the same as room temperature. It is patterned using positive photoresist and standard photolithographic methods. The seed layer and the overlying buffer layer are removed from desired regions (44 and 64) by ion milling. We use approximately 0.5 $mA/cm^2$ ion current density, incident at 45° to the rotating surface of the structure, and mill for approximately 75 seconds. The structure is removed from the ion mill and is cleaned with acetone to remove the remaining photoresist and to prepare the surface for further growth. The mounting procedure is repeated for good thermal contact between the substrate and the substrate heater, and the ensemble is again mounted in the growth chamber.

The second deposition sequence commences with a buffer layer which matches the protective layer last deposited. Approximately 10 nm of $CeO_2$ is deposited atop the previous layers at 810° C., 100 mTorr of $O_2$, $2J/cm^2$ and a deposition time of 20 seconds.

Finally, the high temperature superconductor is deposited. Using a stoichiometric target, $YBa_2Cu_3O_7$ is deposited at 780° C., 400 mTorr of $O_2$, $2J/cm^2$ and a deposition rate of approximately 15 nm/minute. Deposition of YBCO is continued until the desired thickness is attained, typically 30 to 300 nm. After deposition, the sample is cooled to room temperature in approximately 600 mTorr of $O_2$ at a rate of about 45° C./minute. This completes the formation of layers 60 and 20 as seen in FIG. 7. The grain boundary 30 is a 45° grain boundary which forms between the regions which were protected during the patterning (42, 62) and those which were not (44, 64). In other words, regions of subsequent layers grown atop the regions containing a layer of seed material (MgO in this case) are misoriented by 45° from regions of subsequent layers grown atop the regions in which the seed material was removed by patterning.

Although the description above contains many specificities, these should not be construed as limiting the scope of the invention but as merely providing illustrations of the preferred embodiment of this invention. Other experimenters will no doubt find other deposition sequences and process parameters that may result in the same invention. The particular process parameters, deposition sequences, and choices of materials are therefore not intended to limit the scope of this invention.

The scope of the invention should be determined by the appended claims and their legal equivalents, rather than by the examples given.

What is claimed is:

1. A method of fabricating a weak-link junction on a planar surface of a uniform substrate having a first region and a second region adjacent said first region and a border between said first region and said second region comprising:
(a) a first deposition step of depositing one or more intermediate layers of materials onto said substrate, at least one of said layers being a seed layer which overlies said first region only,
(b) a second deposition step of depositing a film of superconducting material over said substrate and said intermediate layers, said superconducting film in said first region having a different crystal orientation than said superconducting film in said second region, whereby a weak-link junction is formed in said superconducting film by the mismatch in orientation along said border between the superconducting film in said first region and the superconducting film in said second region.

2. A method according to claim 1, wherein said first deposition step comprises: depositing a seed layer onto said substrate in said first region and said second region, and removing said seed layer from said substrate in said second region only.

3. The method of claim 1, wherein said first deposition step comprises: treating the surface of said substrate in region two only and then depositing said seed layer material, said seed layer material forming a high quality continuous film in said first region only.

4. The method of claim 1, wherein said first deposition step comprises subjecting said second region of said substrate to graphoepitaxy and then depositing said seed layer, said seed layer adhering in said first region only.

5. The method of claim 1 in which said first deposition step includes depositing at least one intermediate layer to an arbitrarily small thickness, even less than one atomic monolayer.

6. The method of claim 1 in which said first deposition step includes depositing at least one buffer layer.

7. The method of claim 6 wherein said substrate is YSZ having the orientation denoted [100] (001) and wherein said first deposition step comprises depositing a seed layer of YBCO having the orientation denoted [100] (001) in said first region, and said second deposition step comprises depositing a superconducting film of YBCO over said first region and over said second region whereby said weak-link grain boundary junction is formed between said YBCO in said first region having the orientation denoted [100] (001) and said YBCO in said second region having the orientation denoted [110] (001).

8. The method of claim 6 wherein said substrate is YSZ having the orientation denoted [100] (001) and wherein said first deposition step comprises depositing a seed layer of YBCO having the orientation denoted [110] (001) in said first region, and said second deposition step comprises depositing a superconducting film of YBCO over said first region and over said second region whereby said weak-link grain boundary junction is formed between said YBCO in said first region having the orientation denoted [110] (001) and said YBCO in said second region having the orientation denoted [100] (001).

9. The method of claim 6 wherein said substrate is YSZ having the orientation denoted [100] (001) and wherein said first deposition step comprises depositing a seed layer of SrTiO$_3$ having the orientation denoted (110) in said first region, and said second deposition step comprises depositing a superconducting film of YBCO over said first region and over said second region whereby said weak-link grain boundary junction is formed between said YBCO in said first region having the orientation denoted either (110) or (103) or a mixture thereof and said YBCO in said second region having the orientation denoted [100] (001).

10. The method of claim 6 wherein said substrate is chosen from the group consisting of SrTiO$_3$ having the orientation denoted (110), LaAlO$_3$ having the orientation denoted [100] (001), and CaTiO$_3$ having the orientation denoted [100] (001), and wherein said first deposition step comprises depositing a seed layer of YSZ having the orientation denoted [110] (001) in said first region, and said second deposition step comprises depositing a superconducting film of YBCO over said first region and over said second region whereby said weak-link grain boundary junction is formed between said YBCO in said first region having the orientation denoted [110] (001) and said YBCO in said second region having the orientation denoted [100] (001).

11. The method of claim 1 wherein said first deposition step comprises depositing at least one seed layer in said first region only and then depositing at least one buffer layer in said first region and in said second region.

12. The method of claim 11 wherein said substrate is r-plane Al$_2$O$_3$ having the orientation denoted [$\bar{2}$021] (1$\bar{1}$02) and wherein said first deposition step comprises depositing a seed layer of MgO having the orientation denoted [110] (001) in said first region and then depositing a buffer layer of SrTiO$_3$ having the orientation denoted [110] (001) in said first region and having the orientation denoted [100] (001) in said second region, and wherein said second deposition step comprises depositing a superconducting film of YBCO in said first region and in said second region, whereby said weak-link grain boundary junction is formed between said YBCO in said first region having the orientation denoted [110] (001) and said YBCO in said second region having the orientation denoted [100] (001).

13. The method of claim 11 wherein said substrate is r-plane Al$_2$O$_3$ having the orientation denoted [$\bar{2}$021] (1$\bar{1}$02) and wherein said first deposition step comprises depositing a seed layer of SrTiO$_3$ having the orientation denoted [100] (001) in said first region only and then depositing a buffer layer of MgO in said first region and in said second region and then depositing a buffer layer of SrTiO$_3$ in said first region and in said second region wherein said buffer layers have the orientation denoted [100] (001) in said first region and have the orientation denoted [110] (001) in said second region, and wherein said second deposition step comprises depositing a superconducting film of YBCO in said first region and in said second region, whereby said weak-link grain boundary junction is formed between said YBCO in said first region having the orientation denoted [100] (001) and said YBCO in said second region having the orientation denoted [110] (001).

14. The method of claim 11 wherein said substrate is r-plane Al$_2$O$_3$ having the orientation denoted [$\bar{2}$021] (1$\bar{1}$02) and wherein said first deposition step comprises depositing a seed layer of MgO having the orientation denoted [110] (001) in said first region and then depositing at least one buffer layer chosen from the group consisting of CeO$_2$, LaAlO$_3$, SrTiO$_3$, and CaTiO$_3$ wherein said buffer layer has the orientation denoted [110] (001) in said first region and has the orientation denoted [100] (001) in said second region, and wherein said second deposition step comprises depositing a superconducting film of YBCO in said first region and in said second region, whereby said weak-link grain boundary junction is formed between said YBCO in said first region having the orientation denoted [110] (001) and said YBCO in said second region having the orientation denoted [100] (001).

15. The method of claim 11 wherein said substrate is r-plane $Al_2O_3$ having the orientation denoted [$\bar{2}$021] (1$\bar{1}$02) and wherein said first deposition step comprises depositing in said first region only a seed layer chosen from the group consisting of $SrTiO_3$ having the orientation denoted [100] (001) and $CaTiO_3$ having the orientation denoted [100] (001) and then depositing a buffer layer of MgO in said first region and in said second region, wherein said buffer layer has the orientation denoted [100] (001) in said first region and has the orientation denoted [110] (001) in said second region, and wherein said second deposition step comprises depositing a superconducting film of YBCO in said first region and in said second region, whereby said weak-link grain boundary junction is formed between said YBCO in said first region having the orientation denoted [100] (001) and said YBCO in said second region having the orientation denoted [110] (001).

16. The method of claim 11 wherein said substrate is r-plane $Al_2O_3$ having the orientation denoted [$\bar{2}$021] (1$\bar{1}$02)and wherein said first deposition step comprises depositing a seed layer of YSZ having the orientation denoted (001) in said first region only and then depositing a buffer layer of $SrTiO_3$ having the orientation denoted [110] (001) in said first region and having the orientation denoted [100] (001) in said second region, and wherein said second deposition step comprises depositing a superconducting film of YBCO in said first region and in said second region, whereby said weak-link grain boundary junction is formed between said YBCO in said first region having the orientation denoted either (110) or (103) or a mixture thereof and said YBCO in said second region having the orientation denoted [100] (001).

17. The method of Clam 1 wherein said first deposition step comprises depositing at least one buffer layer in said first region only and then depositing at least one seed layer in said first region only and then depositing at least one buffer layer in said first region and in said second region.

18. The method of claim 17 wherein said substrate is r-plane $Al_2O_3$ having the orientation denoted [$\bar{2}$021] (1$\bar{1}$02) and wherein said first deposition step comprises depositing a buffer layer of $SrTiO_3$ having the orientation denoted [110] (001) in said first region only, and then depositing a seed layer of MgO having the orientation denoted [110] (001) in said first region only, and then depositing a buffer layer of $SrTiO_3$ having the orientation denoted [110] (001) in said first region and having the orientation denoted [100] (001) in said second region, and wherein said second deposition step comprises depositing a superconducting film of YBCO in said first region and in said second region, whereby said weak-link grain boundary junction is formed between said YBCO in said first region having the orientation denoted [110] (001) and said YBCO in said second region having the orientation denoted [100] (001).

19. The method of claim 17 wherein said substrate is r-plane $Al_2O_3$ having the orientation denoted [$\bar{2}$021] (1$\bar{1}$02) and wherein said first deposition step comprises depositing a buffer layer of $SrTiO_3$ having the orientation denoted [110] (001) in said first region only, and then depositing a seed layer of MgO having the orientation denoted [110] (001) in said fist region only, and then depositing at least one buffer layer chosen from the group consisting of $CeO_2$, $LaAlO_3$, $SrTiO_3$, and $CaTiO_3$, said buffer layer having the orientation denoted [110] (001) in said first region and having the orientation denoted [100] (001) in said second region, and wherein said second deposition step comprises depositing a superconducting film of YBCO in said first region and in said second region, whereby said weak-link grain boundary junction is formed between said YBCO in said first region having the orientation denoted [110] (001) and said YBCO in said second region having the orientation denoted [100] (001).

20. The method of claim 1 wherein said first deposition step comprises depositing at least one buffer layer in said first region and in said second region and then depositing at least one seed layer in said first region only.

21. The method of claim 1 wherein said first deposition step comprises depositing at least one buffer layer in said first region and in said second region and then depositing at least one seed layer in said first region only, and then depositing at least one buffer layer in said first region and in said second region.

22. The method of claim 1 wherein said first deposition step comprises depositing at least one seed layer in said first region only, and depositing at least one seed layer in said second region only.

23. The method of claim 22 wherein said substrate is YSZ having the orientation denoted [100] (001) and wherein said first deposition step comprises depositing a seed layer of YBCO having the orientation denoted [100] (001) in said first region, and depositing a seed layer of YBCO having the orientation denoted [110] (001) in said second region, and wherein said second deposition step comprises depositing a superconducting film of YBCO in said first region and in said second region, whereby said weak-link grain boundary junction is formed between said YBCO in said first region having the orientation denoted [110] (001) and said YBCO in said second region having the orientation denoted [100] (001).

24. The method of claim 1 wherein said fist deposition step comprises depositing at least one seed layer in said first region only, and depositing at least one seed layer in said second region only and then depositing at least one buffer layer in said first region and in said second region.

25. The method of claim 24 wherein said substrate is YSZ having the orientation denoted [100] (001) and wherein said first deposition step comprises depositing a seed layer of YBCO having the orientation denoted [100] (001) in said first region, and depositing a seed layer of YBCO having the orientation denoted [110] (001) in said second region, and then depositing a buffer layer of $SrTiO_3$ having the orientation denoted [100] (001) in said first region and [110] (001) in said second region and wherein said second deposition step comprises depositing a superconducting film of YBCO in said first region and in said second region, whereby said weak-link grain boundary junction is formed between said YBCO in said first region having the orientation denoted [100] (001) and said YBCO in said second region having the orientation denoted [110] (001).

26. The method of claim 1 wherein said first deposition step comprises depositing at least one buffer layer in said first region and in said second region and then depositing at least one seed layer in said first region only, and depositing at least one seed layer in said second region only, and then depositing at least one buffer layer in said first region and in said second region.

27. The method of claim 1 wherein said first deposition step further comprises the step of sloping the surface of an intermediate layer so it has an angle of less than 45° with the surface of the substrate.

28. The method of claim 1 wherein said first deposition step further comprises the step of sloping the surface of an intermediate layer so it has an angle of less than 10° with the surface of the substrate.

29. The method of claim 1 wherein said second deposition step comprises the step of depositing a superconducting oxide, said oxide having a superconducting transition temperature greater than 15K.

30. The method of claim 29 wherein said superconducting oxide is chosen from the group consisting of mixed-metal cuprates and mixed-metal bismuthates.

31. The method of claim 1 wherein said second deposition step comprises the step of depositing a superconducting film having a crystal lattice orientation in said first region which is rotated in-plane by more than 5° and less than 90° with respect to the crystal lattice orientation in said second region.

32. The method of claim 1 in which the method of depositing the superconducting layer is selected from the group consisting of sputtering, laser ablation, chemical vapor deposition, metal-organic chemical vapor deposition, and liquid phase epitaxy.

33. The method of claim 2, wherein said first deposition step is accomplished under substantially different process conditions than said second deposition step, said conditions being chosen from the group consisting of substrate temperature, density of plasma, partial pressure of oxygen and total gas pressure.

34. The method of claim 2 in which said intermediate layers are defined on a planar substrate using conventional lithographic techniques, and thereby induce grain boundary weak-link junctions that are located in predetermined, specific positions and geometries.

* * * * *